United States Patent
Shibazaki

(10) Patent No.: US 8,237,916 B2
(45) Date of Patent: Aug. 7, 2012

(54) MOVABLE BODY DRIVE SYSTEM, PATTERN FORMATION APPARATUS, EXPOSURE APPARATUS AND EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 837 days.

(21) Appl. No.: 12/343,862

(22) Filed: Dec. 24, 2008

(65) Prior Publication Data

US 2009/0190110 A1 Jul. 30, 2009

Related U.S. Application Data

(60) Provisional application No. 61/006,814, filed on Jan. 31, 2008.

(30) Foreign Application Priority Data

Dec. 28, 2007 (JP) .................................. 2007-340706

(51) Int. Cl.
*G03B 27/42* (2006.01)
*G03B 27/52* (2006.01)
(52) U.S. Cl. ........................................... 355/53; 355/55
(58) Field of Classification Search .................... 355/53, 355/55, 72; 356/356–358
See application file for complete search history.

(56) References Cited

U.S. PATENT DOCUMENTS

| | | | |
|---|---|---|---|
| 4,780,617 A | 10/1988 | Umatate et al. | |
| 5,196,745 A | 3/1993 | Trumper | |
| 5,448,332 A | 9/1995 | Sakakibara et al. | |
| 5,610,715 A | * | 3/1997 | Yoshii et al. .................. 356/499 |
| 5,646,413 A | 7/1997 | Nishi | |
| 6,262,796 B1 | 7/2001 | Loopstra et al. | |
| 6,611,316 B2 | 8/2003 | Sewell | |
| 6,639,686 B1 | 10/2003 | Ohara | |
| 6,778,257 B2 | 8/2004 | Bleeker et al. | |

(Continued)

FOREIGN PATENT DOCUMENTS

EP   0 482 553 A2   4/1992

(Continued)

OTHER PUBLICATIONS

Aug. 11, 2011 Office Action in Chinese Patent Application No. 200880019418.X (with English translation).

(Continued)

*Primary Examiner* — Hung Henry Nguyen
(74) *Attorney, Agent, or Firm* — Oliff & Berridge, PLC

(57) ABSTRACT

A stage device is equipped with a first scale which is placed with a Y-axis direction serving as its longitudinal direction and in which a first grating whose periodic direction is in an X-axis direction is formed and a second scale which is placed with the X-axis direction serving as its longitudinal direction and in which a second grating whose periodic direction is orthogonal to the periodic direction of the first grating is formed, the first scale and the second scale being placed on a plane which a wafer stage faces. Further, on the upper surface of the wafer stage, a plurality of X heads placed at different positions in the X-axis direction and a plurality of Y heads placed at different positions in the Y-axis direction are arranged. An encoder system that has these heads measures positional information of the stage within an XY plane, based on an output of the X head facing the first scale and an output of the Y head facing the second scale.

16 Claims, 8 Drawing Sheets

U.S. PATENT DOCUMENTS

| | | |
|---|---|---|
| 7,023,610 B2 | 4/2006 | Ohtsuki et al. |
| 7,161,659 B2 | 1/2007 | Van Den Brink et al. |
| 7,238,931 B2 | 7/2007 | Nabeshima et al. |
| 7,333,174 B2 | 2/2008 | Koenen et al. |
| 7,602,489 B2 * | 10/2009 | Van Der Pasch et al. ..... 356/399 |
| 2002/0041380 A1 | 4/2002 | Kwan |
| 2003/0025890 A1 | 2/2003 | Nishinaga |
| 2004/0263846 A1 | 12/2004 | Kwan |
| 2006/0139660 A1 | 6/2006 | Kwan |
| 2006/0227308 A1 | 10/2006 | Brink et al. |
| 2006/0227309 A1 | 10/2006 | Loopstra et al. |
| 2007/0052976 A1 | 3/2007 | Pril et al. |
| 2007/0127006 A1 | 6/2007 | Shibazaki |
| 2007/0195296 A1 | 8/2007 | Van Der Pasch et al. |
| 2007/0263191 A1 | 11/2007 | Shibazaki |
| 2007/0263197 A1 | 11/2007 | Luttikhuis et al. |
| 2007/0288121 A1 | 12/2007 | Shibazaki |
| 2008/0043212 A1 | 2/2008 | Shibazaki |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094604 A1 | 4/2008 | Shibazaki |
| 2008/0106722 A1 | 5/2008 | Shibazaki |
| 2008/0218713 A1 | 9/2008 | Shibazaki |

FOREIGN PATENT DOCUMENTS

| | | |
|---|---|---|
| JP | A-04-265805 | 9/1992 |
| JP | A-07-270122 | 10/1995 |
| JP | A-2002-151405 | 5/2002 |
| JP | A-2006-332656 | 12/2006 |
| JP | A-2007-129194 | 5/2007 |
| WO | WO 99/49504 | 9/1999 |
| WO | WO 01/35168 A1 | 5/2001 |
| WO | WO 2005/074014 A1 | 8/2005 |
| WO | WO 2007/083758 A1 | 7/2007 |
| WO | WO 2007/097350 A1 | 8/2007 |

OTHER PUBLICATIONS

Chinese Office Action issued in Chinese Application No. 200880019418.X dated Mar. 30, 2011 (with translation).

Written Opinion of the International Searching Authority issued in International Application No. PCT/JP2008/003950 dated Apr. 7, 2009 (with translation).

International Search Report issued in International Application No. PCT/JP2008/003950 dated Apr. 7, 2009 (with translation).

* cited by examiner

MOVABLE BODY DRIVE SYSTEM, PATTERN FORMATION APPARATUS, EXPOSURE APPARATUS AND EXPOSURE METHOD, AND DEVICE MANUFACTURING METHOD

CROSS-REFERENCE TO RELATED APPLICATIONS

This non-provisional application claims the benefit of Provisional Application No. 61/006,814 filed Jan. 31, 2008, the disclosure of which is hereby incorporated herein by reference in its entirety.

BACKGROUND OF THE INVENTION

1. Field of the Invention

The present invention relates to movable body drive systems, pattern formation apparatuses, exposure apparatuses and exposure methods, and device manufacturing methods, and more particularly to a movable body drive system that measures the position of a movable body using an encoder system and drives the movable body substantially along a predetermined plane, a pattern formation apparatus equipped with the movable body drive system, an exposure apparatus equipped with the movable body drive system and the exposure method using the movable body drive system, and a device manufacturing method using the exposure apparatus or the exposure method.

2. Description of the Background Art

Conventionally, in a lithography process for manufacturing microdevices (electron devices) such as semiconductor devices and liquid crystal display devices, an exposure apparatus such as a projection exposure apparatus by a step-and-repeat method (a so-called stepper) or a projection exposure apparatus by a step-and-scan method (a so-called scanning stepper (which is also called a scanner) is mainly used.

In this type of exposure apparatus, in general, position measurement of a stage that holds a wafer, for example, was performed using a laser interferometer. However, a level of required performance has become higher due to finer patterns accompanying higher integration of semiconductor devices. For example, a permissible value of a total overlay error becomes an order of several nm, and according to this permissible value, a permissible value of a position control error of the stage becomes less than or equal to a subnano order. Accordingly, short-term variation of measurement values caused by air fluctuations that is generated due to temperature variation and/or temperature gradient of an atmosphere in a beam path of the laser interferometer cannot be ignored any more.

Therefore, recently, an encoder having a high resolution that is hardly affected by air fluctuations compared with the interferometer has been gathering attention, and an exposure apparatus that uses the encoder for position measurement of a wafer stage or the like is proposed (e.g. refer to U.S. Patent Application Publication No. 2006/0227309, and the like). In the case of an exposure apparatus described in the U.S. Patent Application Publication described above, a grid plate is used, which is located above a substrate table and covers a wide range of an area including an entire area of a movement range of the substrate table.

However, since it is difficult to manufacture the grid plate with a large area and high precision as is disclosed in the U.S. Patent Application Publication described above, a plurality of grid plates needed to be placed side by side. Fighter, to use the grid plate having a large area as is disclosed in the U.S. Patent Application Publication described above has drawbacks in terms of layout and accuracy, and also is almost unrealistic especially in terms of cost.

SUMMARY OF THE INVENTION

The present invention has been made in view of the circumstances described above, and according to a first aspect of the present invention, there is provided a first movable body drive system that drives a movable body substantially along a predetermined plane, the system comprising: a first scale which is placed, with a first direction serving as its longitudinal direction, on a first plane that faces the movable body and is parallel to the predetermined plane, and in which a first grating whose periodic direction is in the first direction or in a second direction perpendicular to the first direction is formed; a second scale which is placed, with the second direction serving as its longitudinal direction, on the first plane, and in which a second grating whose periodic direction is orthogonal to the periodic direction of the first grating is formed; a measurement system which has a first head group including a plurality of first heads that are placed at different positions in the second direction on a second plane of the movable body substantially parallel to the predetermined plane and have their measurement directions in the periodic direction of the first grating, and a second head group including a plurality of second heads that are placed at different positions in the first direction on the second plane of the movable body and have their measurement directions in the periodic direction of the second grating, and which computes positional information of the movable body in at least directions of two degrees of freedom within the predetermine plane including the first and second directions based on an output of the first head that faces the first scale and an output of the second head that faces the second scale; and a drive system that drives the movable body along the predetermined plane based on the positional information that has been computed by the measurement system.

With this system, based on the output of the first head that faces the first scale and the output of the second head that faces the second scale, the measurement system computes positional information of the movable body in at least directions of two degrees of freedom within the predetermined plane including the first and second directions, and based on the positional information that has been computed by the measurement system, the drive system drives the movable body along the predetermined plane. Accordingly, the movable body can be driven along the predetermined plane with high precision, based on the measurement values of the measurement system in the entire area of a movement range of the movable body, without placing scales (gratings) corresponding to the entire area of the movement range of the movable body.

According to a second aspect of the present invention, there is provided a second movable body drive system that drives a movable body substantially along a predetermined plane, the system comprising: a scale which is placed, with a first direction serving as its longitudinal direction, on a first plane that faces the movable body and is parallel to the predetermined plane, and in which a two-dimensional grating whose periodic directions are in the first direction and in a second direction perpendicular to the first direction is formed; a measurement system which has a plurality of two-dimensional heads that are placed at different positions in the second direction on a second plane of the movable body substantially parallel to the predetermined plane and have their measurement directions in the first and second directions, and which computes positional information of the movable body in at least directions of two degrees of freedom within the predetermine plane including the first and second directions based on an output of the two-dimensional head that faces the scale; and a drive system that drives the movable body along the predetermined plane based on the positional information that has been computed by the measurement system.

With this system, based on the output of the two-dimensional head that faces the scale, the measurement system computes positional information of the movable body in at least directions of two degrees of freedom within the predetermine plane including the first and second directions, and based on the positional information that has been computed by the measurement system, the drive system drives the movable body along the predetermined plane. Accordingly, the movable body can be driven along the predetermined plane with high precision, based on the measurement values of the measurement system in the entire area of a movement range of the movable body, without placing scales (gratings) corresponding to the entire area of the movement range of the movable body.

According to a third aspect of the present invention, there is provided a pattern formation apparatus that forms a pattern on an object, the apparatus comprising: a patterning device that generates a pattern on the object; and one of the first and second movable body drive systems of the present invention, whereby a movable body, on which the object is mounted, is driven by the movable body drive system, for pattern formation to the object.

With this apparatus, by the patterning device generating a pattern on an object on the movable body that is driven with high precision by one of the first and second movable body drive systems of the present invention, it becomes possible to form the pattern on the object with high precision.

According to a fourth aspect of the present invention, there is provided a first exposure apparatus that forms a pattern on an object with irradiation of an energy beam, the apparatus comprising: a patterning device that irradiates the object with the energy beam; and one of the first and second movable body drive systems of the present invention, whereby a movable body, on which the object is mounted, is driven by the movable body drive system, for relative movement of the energy beam and the object.

With this apparatus, for relative movement of an energy beam that is irradiated from the patterning device to an object and the object, the movable body on which the object is mounted is driven with high precision by one of the first and second movable body drive systems of the present invention. Accordingly, the pattern can be formed on the object with high precision by scanning exposure.

According to a fifth aspect of the present invention, there is provided a second exposure apparatus that exposes an object with an energy beam, the apparatus comprising: a movable body that can move along a predetermined plane, while holding the object; a scale that is placed substantially parallel to the predetermined plane, with a first direction serving as its longitudinal direction; and an encoder system that has a plurality of heads which are arranged on the movable body and whose positions are different in a second direction orthogonal to the first direction within the predetermined plane, and measures positional information of the movable body at least during exposure of the object, using at least one of the plurality of heads that faces the scale.

With this apparatus, a plurality of heads of the encoder system are arranged on the movable body, and positional information of the movable body is measured by at least one of the plurality of heads that faces the scale, which is placed substantially parallel to the predetermined plane with the first direction serving as its longitudinal direction.

According to a sixth aspect of the present invention, there is provided a first device manufacturing method, comprising: exposing an object using one of the first and second exposure apparatuses of the present invention; and developing the exposed object.

According to a seventh aspect of the present invention, there is provided a first exposure method of exposing an object with an energy beam, the method comprising: holding the object with a movable body; and driving the movable body by one of the first and second movable body drive systems of the present invention and exposing the object with the energy beam.

With this method, since the movable body that holds an object is driven with high precision by one of the first and second movable body drive systems of the present invention, favorable exposure can be performed to the object.

According to an eighth aspect of the present invention, there is provided a second exposure method of exposing an object held by a movable body that moves substantially along a predetermined plane, with an energy beam, wherein a first scale and a second scale are placed on a first plane that faces the movable body and is parallel to the predetermined plane, the first scale being placed with a first direction serving as its longitudinal direction and having a first grating formed therein whose periodic direction is in the first direction or in a second direction perpendicular to the first direction, and the second scale being placed with the second direction serving as its longitudinal direction, and having a second grating formed therein whose periodic direction is orthogonal to the periodic direction of the first grating, the method comprises: a measurement process of computing positional information of the movable body in at least directions of two degrees of freedom within the predetermine plane including the first and second directions, based on an output of a first head that faces the first scale and an output of a second head that faces the second scale, from among a first head group including a plurality of the first heads that are placed at different positions in the second direction on a second plane of the movable body substantially parallel to the predetermined plane and have their measurement directions in the periodic direction of the first grating, and a second head group including a plurality of the second heads that are placed at different positions in the first direction on the second plane of the movable body and have their measurement directions in the periodic direction of the second grating; and a drive process of driving the movable body along the predetermined plane based on the positional information that has been computed in the measurement process.

With this method, based on the output of the first head that faces the first scale and the output of the second head that faces the second scale, positional information of the movable body in at least directions of two degrees of freedom within the predetermined plane including the first and second directions is computed, and based on the computed positional information, the movable body is driven along the predetermined plane. Accordingly, the movable body can be driven along the predetermined plane with high precision based on the measurement values of the measurement system in the entire area of a movement range of the movable body, without placing scales (gratings) corresponding to the entire area of the movement range of the movable body, and hence high-precision exposure can be performed to an object held on the movable body.

According to a ninth aspect of the present invention, there is provided a third exposure method of exposing an object held by a movable body that moves substantially along a predetermined plane, with an energy beam, wherein a scale, in which a two-dimensional grating whose periodic directions are in a first direction and in a second direction perpendicular to the first direction is formed, is placed with the first direction serving as its longitudinal direction, on a first plane that faces the movable body and is parallel to the predetermined plane; the method comprises: a measurement process of computing positional information of the movable body in at least directions of two degrees of freedom within the predetermine plane including the first and second directions based on an output of a two-dimensional head that faces the scale, from among a plurality of the two-dimensional heads that are placed at different positions in the second direction on a second plane of the movable body substantially parallel to the predetermined plane and have their measurement directions in the first and second directions; and a drive process of driving the movable body along the predetermined plane based on the positional information that has been computed in the measurement process.

With this method, based on the output of the two-dimensional head that faces the scale, positional information of the movable body in at least directions of two degrees of freedom within the predetermined plane including the first and second directions is computed, and based on the computed positional information, the movable body is driven along the predetermined plane. Accordingly, the movable body can be driven along the predetermined plane with high precision based on the measurement values of the measurement system in the entire area of a movement range of the movable body, without placing scales (gratings) corresponding to the entire area of the movement range of the movable body, and hence high-precision exposure can be performed to an object held on the movable body.

According to a tenth aspect of the present invention, there is provided a fourth exposure method of exposing an object held by a movable body that can move along a predetermined plane, with an energy beam, the method comprising: measuring positional information of the movable body at least during exposure of the object, with at least one head of a plurality of heads that faces a scale that is placed substantially parallel to the predetermined plane with a first direction serving as its longitudinal direction, by using an encoder system that has the plurality of heads which are arranged on the movable body and whose positions are different in a second direction orthogonal to the first direction within the predetermined plane.

With this method, by using the encoder system having a plurality of heads whose positions are different in the second direction that are arranged on the movable body, positional information of the movable body is measured by at least one of the plurality of heads that faces the scale that is placed substantially parallel to the predetermined plane with the first direction serving as its longitudinal direction, at least during exposure of an object.

According to an eleventh aspect of the present invention, there is provided a second device manufacturing method, comprising: exposing an object using any one of the second, third and fourth exposure methods of the present invention; and developing the exposed object.

BRIEF DESCRIPTION OF THE DRAWINGS

In the accompanying drawings.

DESCRIPTION OF THE EMBODIMENTS

An embodiment of the present invention is described below, with reference to FIGS. 1 to 7.

Figure 1:
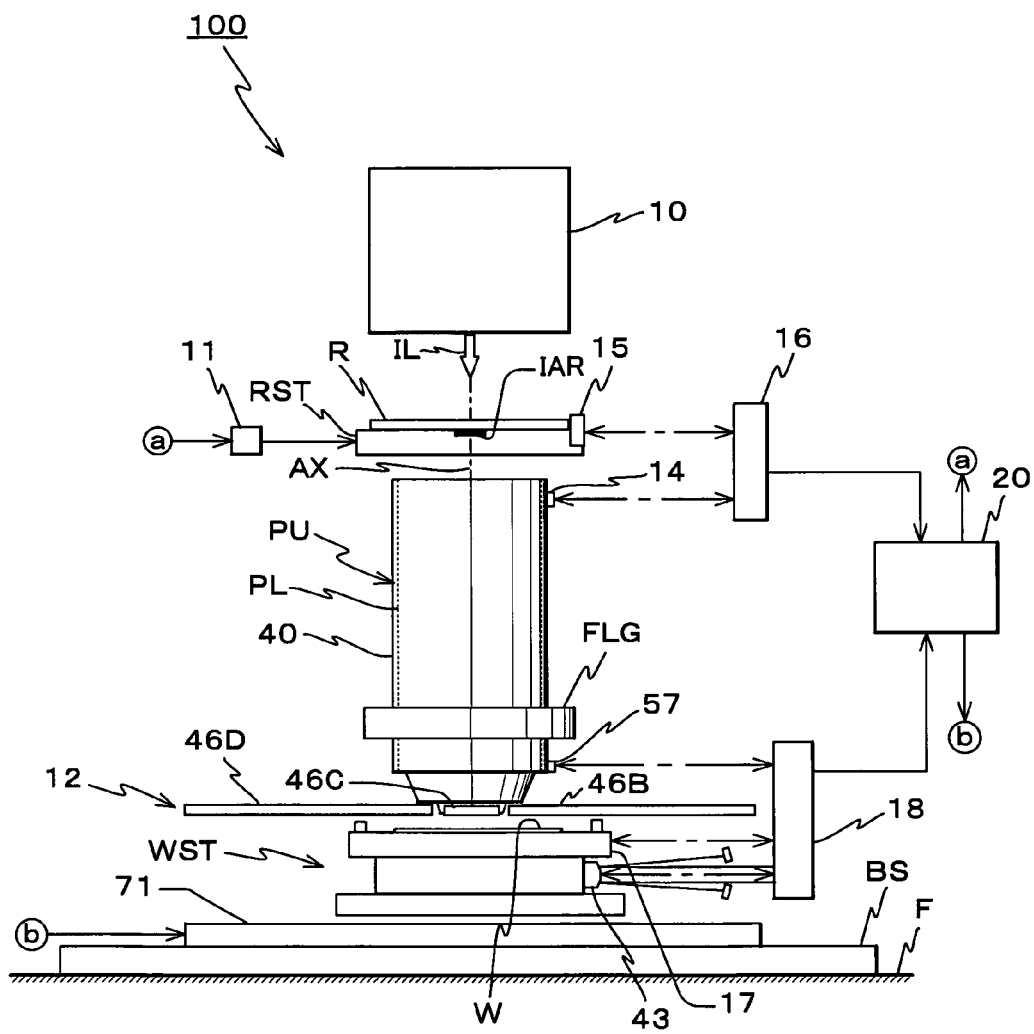
FIG. 1 is a view schematically showing a configuration of an exposure apparatus related to an embodiment.

FIG. 1 shows a schematic configuration of an exposure apparatus 100 related to the embodiment. Exposure apparatus 100 is a reduction projection exposure apparatus by a step-and-scan method, which is a so-called scanner. As is described later, a projection optical system PL is provided in this embodiment, and in the description below, the explanation is given assuming that a direction parallel to an optical axis AX of projection optical system PL is a Z-axis direction, a direction in which a reticle and a wafer are relatively scanned within a plane orthogonal to the Z-axis direction is a Y-axis direction, and a direction that is orthogonal to a Z-axis and a Y-axis is an X-axis direction, and rotation (inclination) directions about an X-axis, the Y-axis and the Z-axis are θx, θy and θz directions, respectively.

Exposure apparatus 100 is equipped with an illumination system 10, a reticle stage RST that holds a reticle R, a projection unit PU, a wafer stage device 12 including a wafer stage WST on which wafer W is mounted, and their control system, and the like.

As is disclosed in, for example, U.S. Patent Application Publication No. 2003/0025890 and the lie, illumination system 10 includes: a light source; and an illumination optical system that has an illuminance uniformity optical system containing an optical integrator and the like, and a reticle blind and the like (none of which are shown). Illumination system 10 illuminates a slit-shaped illumination area IAR, which is defined by the reticle blind (a masking system), on reticle R with an illumination light (exposure light) IL with substantially uniform illuminance. In this case, as illumination light IL, an ArF excimer laser light (wavelength: 193 nm) is used, as an example.

On reticle stage RST, reticle R having a pattern surface (a lower surface in FIG. 1) on which a circuit pattern and the like are formed is fixed by, for example, vacuum suction. Reticle stage RST is finely drivable within the XY plane and also drivable at a designated scanning speed in a scanning direction (which is the Y-axis direction being a lateral direction of the page surface of FIG. 1), with a reticle stage drive system 11 including, for example, a linear motor or the like.

Positional information (including rotational information in the θz direction) of reticle stage RST within the XY plane (a movement plane) is constantly detected at a resolution of, for example, around 0.25 nm with a reticle laser interferometer (hereinafter, referred to as a "reticle interferometer") 16 shown in FIG. 1 via a movable mirror 15 (in actuality, a Y movable mirror (or a retroreflector) having a reflection surface orthogonal to the Y-axis direction and an X movable mirror having a reflection surface orthogonal to the X-axis direction are arranged), with a fixed mirror 14 (in actuality, each of an X fixed mirror and a Y fixed mirror) as a reference, which is fixed to the side surface of a barrel 40 that constitutes projection unit PU.

Projection unit PU is held by a part (a barrel platform) of a body (not shown) via a flange FLG below reticle stage RST in FIG. 1. Projection unit PU includes barrel 40 which has a cylindrical shape and has flange FLG arranged in the vicinity of a lower end of the outer periphery thereof, and projection optical system PL which is held by barrel 40 and is composed of a plurality of optical elements. As projection optical system PL, for example, a dioptric system that is composed of a plurality of optical elements (lens elements) disposed along optical axis AX parallel to the Z-axis direction is used. Projection optical system PL is, for example, both-side telecentric and has a predetermined projection magnification (e.g. one-quarter, or one-fifth). Therefore, when illumination area IAR is illuminated by illumination light IL from illumination system 10, illumination light IL having passed through reticle R whose pattern surface is placed substantially coincident with a first plane (an object plane) of projection optical system PL forms a reduced image of a circuit pattern (a reduced image of apart of a circuit pattern) of the reticle within illumination area IAR on an area (an exposure area) that is conjugate to illumination area IAR described previously on wafer W, which is placed on a second plane (an image plane) side of projection optical system PL and whose surface is coated with a resist (a sensitive agent), via projection optical system PL. Then, by moving reticle R relative to illumination area IAR (illumination light IL) in the scanning direction (the Y-axis direction) and also moving wafer W relative to the exposure area (illumination light IL) in the scanning direction (the Y-axis direction) by synchronous drive of reticle stage RST and wafer stage WST, scanning exposure of one shot area (divided area) on wafer W is performed, and a pattern of reticle R is transferred to the shot area. More specifically, in this embodiment, a pattern is generated on wafer W by illumination system 10, reticle R and projection optical system PL, and the pattern is formed on wafer W by exposure of a sensitive layer (a resist layer) on wafer W with illumination light IL.

Wafer stage device 12 is equipped with a stage base 71 that is supported almost horizontally with a plurality (e.g. 3 or 4) of vibration isolation mechanisms (omitted in the drawings) placed on a base plate BS installed on a floor surface F, wafer stage WST that is placed above stage base 71, a wafer stage drive system 27 (not shown in FIG. 1, refer to FIG. 4) that drives wafer stage WST, and the like.

Stage base 71 is made up of a member having a tabular outer shape, and its upper surface is finished so as to have a very high level of flatness degree, and serves as a guide plane used when wafer stage WST moves. Inside stage base 71, a coil unit is housed, which includes a plurality of coils placed in a matrix shape with the XY two dimensional directions serving as a row direction and a column direction.

Figure 2:
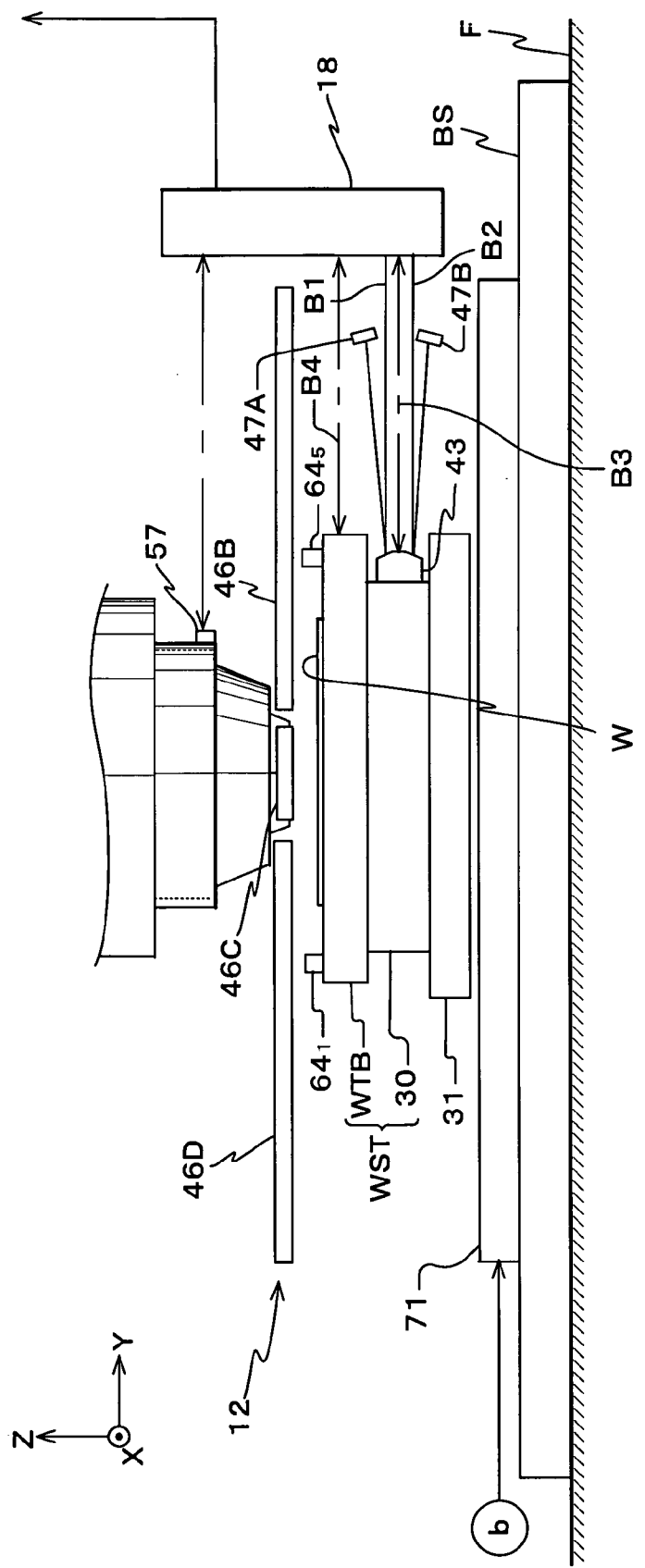
FIG. 2 is a view enlarging and showing components in the vicinity of a stage device shown in FIG. 1.

As shown in FIG. 2, wafer stage WST has a stage main body 30 and a wafer table WTB which is the upper section of stage main body 30, and on the bottom portion of stage main body 30, a magnetic unit 31 having a plurality of magnets, which constitutes a magnetic levitation type planar motor together with the coil unit, is arranged. In the embodiment, the coil unit has not only an X-axis direction drive coil and a Y-axis direction drive coil, but also a Z-axis direction drive coil, and the coil unit and the magnetic unit described above constitute a moving magnet type planar motor (a two dimensional linear actuator) by a electromagnetic drive method (Lorenz force drive method), which drives wafer stage WST in directions of six degrees of freedom which are the X-axis direction, the Y-axis direction, the Z-axis direction, the θx direction, the θy direction, and the θz direction. Wafer stage drive system 27 is configured including the planar motor described above. In the embodiment, the magnitude and direction of electric current supplied to each coil constituting the coil unit are controlled by main controller 20.

Incidentally, wafer stage WST can also employ, for example, a structure that is equipped with a stage main body that is driven within the XY plane by a linear motor, a planar motor, or the like, and a wafer table that is finely driven in at least directions of three degrees of freedom which are the Z-axis direction, the θx direction, and the θy direction on the stage main body by a voice coil motor or the like. In such a case, a planar motor by the Lorenz electromagnetic drive which is disclosed in, for example, U.S. Pat. No. 5,196,745 and the like can also be used. Incidentally, the planar motor is not limited to the Lorenz electromagnetic drive method, but a planar motor by a variable magnetic resistance drive method can also be used.

On wafer table WTB, wafer W is mounted via a wafer holder (not shown), and fixed by, for example, vacuum suction (for electrostatic suction) or the like.

Further, a configuration is employed in which positional information of wafer stage WST within the XY plane can be measured by an encoder system 50 (refer to FIG. 4) including scale members 46B, 46C, 46D and the like, and a wafer laser interferometer system (hereinafter, shortly referred to as an "interferometer system") 18, respectively. A configuration and the like of encoder system 50 and interferometer system 18 for wafer stage WST are described in detail below. Incidentally, the scale member can also be called a grid plate, a grating member, a reference member and the like.

As shown in a plan view of FIG. 3, on the upper surface of wafer table WTB (wafer stage WST), a plurality (ten each, in this case) of X heads (hereinafter, shortly referred to as heads, as needed) $66_1$ to $66_{10}$ and Y heads (hereinafter, shortly referred to as heads, as needed) $64_1$ to $64_{10}$ are arranged so as to enclose wafer W. To be more specific, at the +Y side end and the −Y side end of the wafer table WTB upper surface, X heads $66_1, 66_2, \ldots, 66_5$ and $66_6, 66_7, \ldots, 66_{10}$ are placed at a predetermined distance along the X-axis direction. And, at the +X side end and the −X side end of wafer table WTB upper surface, Y heads $64_1, 64_2, \ldots, 64_5$ and $64_6, 64_7, \ldots, 64_{10}$ are placed at a predetermined distance along the Y-axis direction. As each of Y heads $64_1$ to $64_{10}$ and X heads $66_1$ to $66_{10}$, a head having a configuration similar to the head (the encoder) that is disclosed in, for example, U.S. Pat. No. 7,238,931 or the pamphlet of International Publication No. 2007/083758 (the corresponding U.S. Patent Application Publication No. 2007/

0288121) or the like is used. Incidentally, in the description below, Y heads $64_1$ to $64_{10}$ and X heads $66_1$ to $66_{10}$ are also described as Y heads 64 and X heads 66, respectively.

Figure 3:
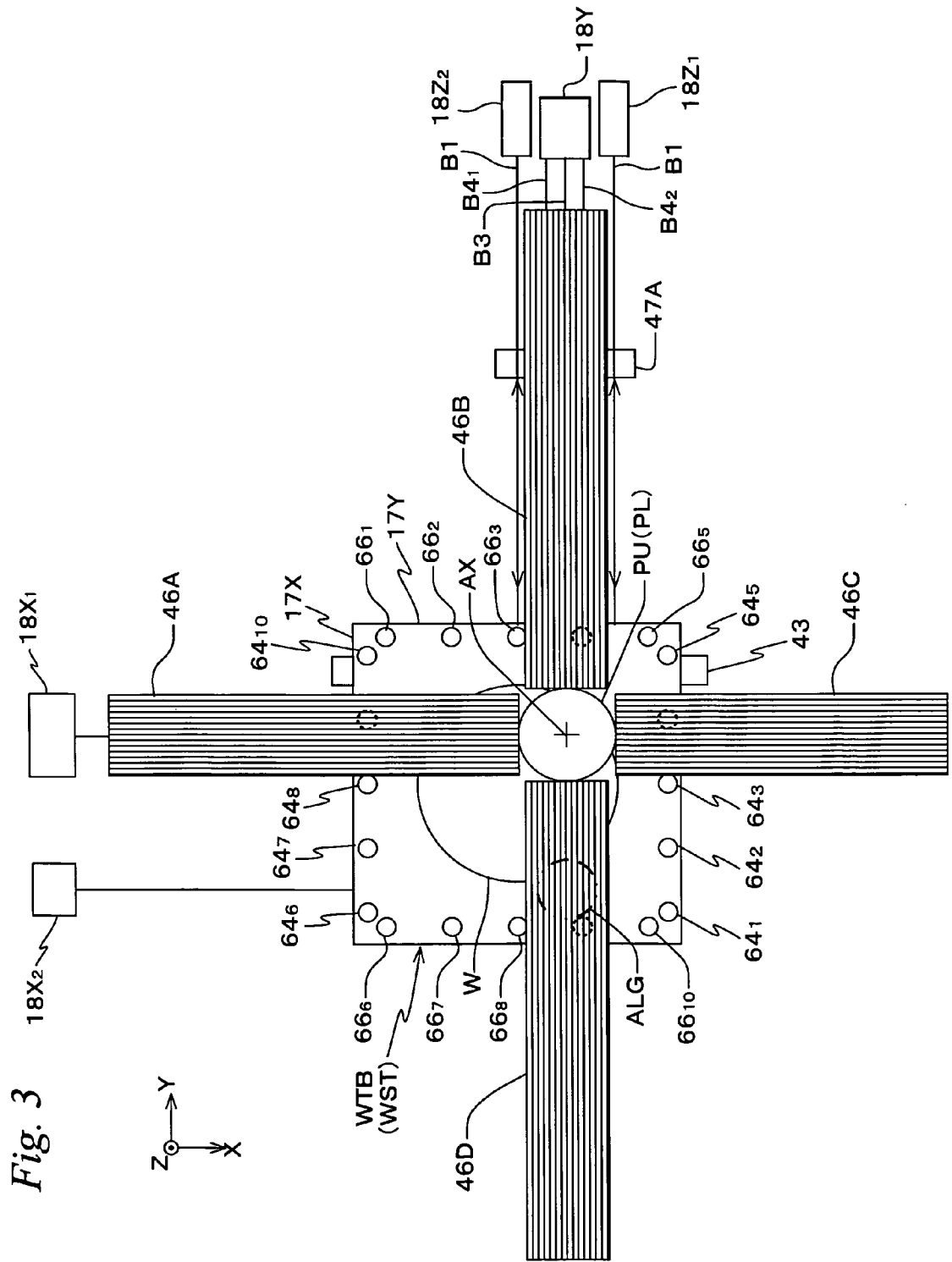
FIG. 3 is a plan view showing a wafer stage together with encoders and interferometers that measure positional information of the wafer stage.

Meanwhile, as can be seen when viewing FIGS. 1 and 3 together, four scale members 46A to 46D are placed in a state of enclosing the periphery of the lowermost end of projection unit PU from four sides. In actuality, scale members 46A to 46D are fixed to the barrel platform in a suspended state via, for example, a support member, although omitted in FIG. 1 to avoid intricacy of the drawing.

Scale members 46A and 46C are placed on the −X side and the +X side of projection unit PU with the X-axis direction serving as their longitudinal directions and are placed symmetrically with respect to optical axis AX of projection optical system PL. Further, scale members 46B and 46D are placed on the +Y side and the −Y side of projection unit PU with the Y-axis direction serving their longitudinal directions and are placed symmetrically with respect to optical axis AX of projection optical system PL.

Scale members 46A to 46D are made of the same material (e.g. a ceramic, a glass having a low thermal expansion, or the like), and on the surface of each scale member (the lower surface in FIG. 1, i.e., the surface on the −Z side), a same reflective diffraction gratings having the periodic direction in a direction perpendicular to the longitudinal direction is formed. This diffraction grating is made by being engraved with a pitch between 138 nm to 4 μm, e.g., with a pitch of 1 μm. Incidentally, in FIG. 3, the pitch of the grating is shown remarkably wider compared with the actual pitch, for the sake of convenience for illustration. Further, on the surfaces (the grating surfaces of scale members 46A to 46D, a cover member (e.g. a glass plate or the like), which is substantially transparent with respect to a measurement beam from the head described above, can be arranged.

Since scale members 46A and 46C have the diffraction gratings whose periodic direction is in the Y-axis direction, they are used for position measurement of wafer stage WST in the Y-axis direction. And, scale members 46B and 46D have the diffraction gratings whose periodic direction is in the X-axis direction, they are used for position measurement of wafer stage WST in the X-axis direction.

In the embodiment, X heads $66_1$, $66_2$, . . . , $66_5$, and $66_6$, $66_7$, . . . , $66_{10}$ are placed on wafer table WTB at a distance with which adjacent two X heads 66 can face a corresponding scale member (diffraction grating) simultaneously, or more specifically, at a distance that is less than or equal to around a length of the diffraction grating in a direction (an arrangement direction of the diffraction grating) that is orthogonal to the longitudinal direction of scale members 46B and 46D.

Similarly, Y heads $64_1$ to $64_5$ and $64_6$ to $64_{10}$ are placed on wafer table WTB at a distance with which adjacent two Y heads 64 can face a corresponding scale member (diffraction grating) simultaneously, or more specifically, at a distance that is less than or equal to around a length of the diffraction grating in a direction (an arrangement direction of the diffraction grating) that is orthogonal to the longitudinal direction of scale members 46A and 46C.

Each of Y heads $64_1$ to $64_5$ and $64_6$ to $64_{10}$ faces any one of scale members 46C and 46A and constitutes a multiple-lens, or to be more precise, five-lens Y linear encoder that measures the Y-position of wafer stage WST. Further, each of X heads X heads $66_1$, $66_2$, . . . , $66_5$, and $66_6$, $66_7$, . . . , $66_{10}$ faces any one of scale members 46B and 46D and constitutes a multiple-lens, or to be more precise, five-lens X linear encoder that measures the X-position of wafer stage WST.

Figure 4:
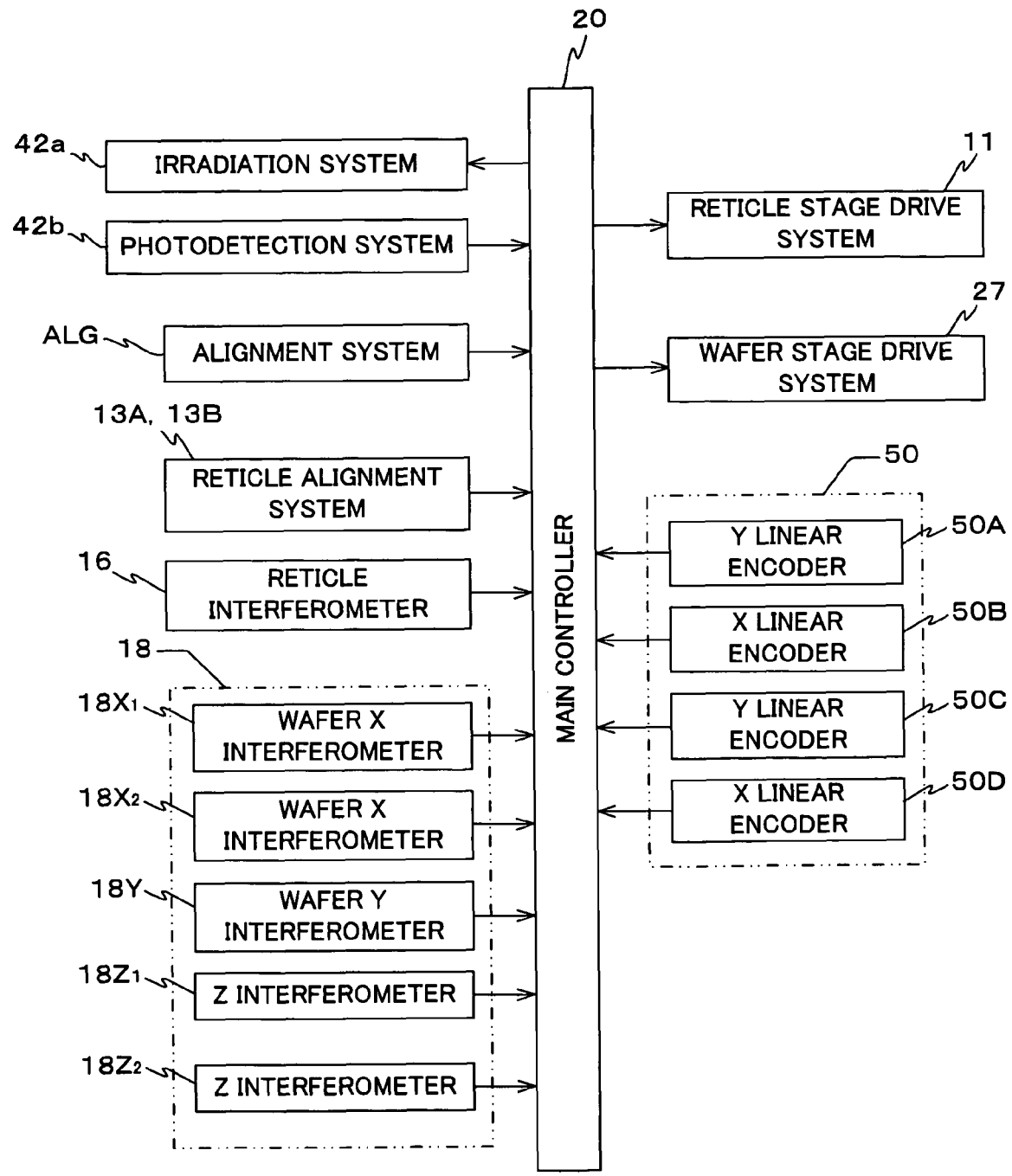
FIG. 4 is a block diagram showing a control system related to stage control of the exposure apparatus of the embodiment with a part of the control system omitted.

In the movement range of wafer stage WST on exposure where wafer W is located below projection optical system PL (projection unit PU), Y heads $64_i$ (i=any one of 1 to 5) and $64_j$ (j=i+5) respectively face scale members 46C and 46A, and also X heads $66_p$ (p=any one of 1 to 5) and $66_q$ (q=p+5) respectively face scale members 46B and 46D. More specifically, the measurement values of four encoders in total, which are a pair of Y linear encoders 50C and 50A (refer to FIG. 4) constituted by Y heads $64_i$ and $64_j$ that face scale members 46C and 46A respectively, and a pair of X linear encoders 50B and 50D (refer to FIG. 4) constituted by X heads $66_p$ and $66_q$ that face scale members 46B and 46D respectively, are supplied to main controller 20. Encoder system 50 shown in FIG. 4 is configured including a pair of Y linear encoders 50C and 50A and a pair of X linear encoders 50B and 50D.

Further, as shown in FIG. 2, interferometer system 18 constantly detects positional information of wafer stage WST, for example, at a resolution of around 0.25 nm, by irradiating a reflection surface formed on the end surface of wafer table WTB and a movable mirror 43 fixed to stage main body 30 with a measurement beam. At least a part of interferometer system 18 (e.g. an optical unit excluding a light source) is fixed to a barrel platform in a suspended state.

As shown in FIG. 3, on wafer stage WST, a reflection surface 17Y that is orthogonal to the Y-axis direction serving as a scanning direction and a reflection surface 17X that is orthogonal to the X-axis direction serving as a non-scanning direction are actually formed, but these reflection surfaces are shown as a reflection surface 17 as a representative in FIG. 1.

As shown in FIG. 3, interferometer system 18 includes five interferometers, which are a wafer Y interferometer 18Y, two wafer X interferometers $18X_1$ and $18X_2$, and a pair of Z interferometers $18Z_1$ and $18Z_2$. As each of these interferometers 18Y, $18X_1$, $18X_2$, $18Z_1$ and $18Z_2$, a Michaelson-type heterodyne laser interferometer that uses two-frequency laser making use of the Zeeman effect is used. Of these interferometers, as wafer Y interferometer 18Y, a multiaxial interferometer is used, which has a plurality of measurement axes including two measurement axes that are symmetric with respect to an axis (a reference axis) parallel to the Y-axis that passes through optical axis AX (the center of the exposure area conjugate to illumination area IAR described earlier) of projection optical system PL and a detection center of an alignment system ALG (to be described later), as shown in FIG. 3. Incidentally, wafer Y interferometer 18Y is further described later on.

Wafer X interferometer $18X_1$ irradiates reflection surface 17X with a measurement beam along a measurement axis that passes through an axis (a reference axis) parallel to the X-axis that passes though optical axis AX (the center of the exposure area described earlier) of projection optical system PL. Wafer X interferometer $18X_1$ measures a displacement of reflection surface 17X, with a reflection surface of the X fixed mirror that is fixed to the side surface of barrel 40 of projection unit PU serving as a reference, as positional information of wafer stage WST in the X-axis direction.

Wafer X interferometer $18X_2$ irradiates reflection surface 17X with a measurement beam along a measurement axis in the X-axis direction that passes through the detection center of alignment system ALG, and measures a displacement of reflection surface 17X, with a reflection surface of the fixed mirror that is fixed to the side surface of alignment system ALG serving as a reference, as positional information of wafer stage WST in the X-axis direction.

Further, as shown in FIGS. 1 and 2, movable mirror 43 with the X-axis direction serving as its longitudinal direction is attached to the side surface on the +Y side of stage main body 30 via a kinematic support mechanism (not shown).

A pair of Z interferometers $18Z_1$ and $18Z_2$ that irradiate movable mirror 43 with measurement beams are placed facing movable mirror 43 (refer to FIG. 3). To be specific, as can be seen when viewing FIGS. 2 and 3 together, movable mirror 43 is made up of a member whose length in the X-axis direction is longer than that of reflection surface 17Y (wafer table WTB) and which has a hexagonal sectional shape like a combination of a rectangular and an isosceles trapezoid. Mirror-polishing is applied to the surface on the +Y side of movable mirror 43, and three reflection surfaces as shown in FIG. 2 are formed.

As can be seen from FIG. 3, Z interferometers $18Z_1$ and $18Z_2$ are placed on one side and the other side of Y interferometer 18Y in the X-axis direction spaced apart at substantially the same distance from Y interferometer 18Y. And, Z interferometers $18Z_1$ and $18Z_2$ are actually placed at a position slightly lower than Y interferometer 18Y, respectively.

From each of Z interferometers $18Z_1$ and $18Z_2$, as shown in FIGS. 2 and 3, a measurement beam B1 in the Y-axis direction is irradiated toward the upper side reflection surface (inclined surface) of movable mirror 43 and a measurement beam B2 in the Y-axis direction is irradiated toward the lower side reflection surface (inclined surface) of movable mirror 43. In this embodiment, a fixed mirror 47A having a reflection surface orthogonal to measurement beam B1 that has been reflected off the upper side reflection surface, and a fixed mirror 47B having a reflection surface orthogonal to measurement beam B2 that has been reflected off the lower side reflection surface are arranged extending in the X-axis direction, respectively, at a position a predetermined distance apart to the +Y direction from projection unit PU in a state of not interfering with measurement beams B1 and B2. Fixed mirrors 47A and 47B are supported by, for example, a same support body (not shown) arranged on the barrel platform that supports projection unit PU.

Measurement beams B1 and B2 in the Y-axis direction from each of Z interferometers $18Z_1$ and $18Z_2$ respectively are irradiated toward movable mirror 43, and these measurement beams B1 and B2 are incident on the upper and lower reflection surfaces of movable mirror 43, respectively, at a predetermined incident angle, and then are reflected off each of the reflection surfaces respectively and are incident perpendicularly to the reflection surfaces of fixed mirrors 47A and 47B. Then, measurement beams B1 and B2 reflected off the reflection surfaces of fixed mirrors 47A and 47B inversely pass through the same optical path as the optical path at the time of incidence and return to Z interferometers $18Z_1$ and $18Z_2$.

As shown in FIG. 3, Y interferometer 18Y irradiates reflection surface 17Y with measurement beams $B4_1$ and $B4_2$ along measurement axes in the Y-axis direction that is a same distance apart on the −X side and +X side from a straight line (reference axis) parallel to the Y-axis that passes through the projection center (optical axis AX, refer to FIG. 1) of projection optical system PL, and receives a reflection light of each of measurement beams $B4_1$ and $B4_2$, thereby detecting positional information of wafer stage WST in the Y-axis direction at irradiation points of measurement beams $B4_1$ and $B4_2$, with a reflection surface of the Y fixed mirror fixed to the side surface of barrel 40 of projection unit PU serving as a reference. Incidentally, in FIG. 2, measurement beams $B4_1$ and $B4_2$ are representatively shown as a beam B4.

Further, Y interferometer 18Y irradiates a measurement beam B3 along a measurement axis in the Y-axis direction that is a predetermined distance spaced apart from measurement beams $B4_1$ and $B4_2$ in the Z-axis direction, toward a center reflection surface parallel to the XZ plane of movable mirror 43, and receives measurement beam B3 reflected off the center reflection surface, thereby detecting the position of the center reflection surface of movable mirror 43 (i.e. wafer stage WST) in the Y-axis direction.

Based on the average value of the measurement values of the measurement axes corresponding to measurement beams $B4_1$ and $B4_2$ of Y interferometer 18Y, main controller 20 computes the Y-position of reflection surface 17Y, that is, the Y-position of wafer table WTB (wafer stage WST), or more specifically, a displacement ΔYo in the Y-axis direction. Further, based on the Y-position of reflection surface 17Y and the center reflection surface of movable mirror 43, main controller 20 computes a displacement (pitching amount) ΔXo of wafer stage WST in the rotational direction (θx direction) about the X-axis direction.

Further, based on the measurement results of Z interferometers $18Z_1$ and $18Z_2$, main controller 20 can computes displacements ΔZo, ΔYo, Δθz and Δθy of wafer stage WST in the Z-axis direction, the Y-axis direction, the θz direction and the θy direction, by the method that is disclosed in, for example, the pamphlet of International Publication No. 2007/083758 (the corresponding U.S. Patent Application Publication No. 2007/0288121) and the like.

Incidentally, in FIG. 1, X interferometers $18X_1$ and $18X_2$, Y interferometer 18Y, and Z interferometers $18Z_1$ and $18Z_2$ are representatively shown as interferometer system 18, and the X fixed mirror for X-axis direction position measurement and the Y fixed mirror for Y-axis direction position measurement are representatively shown as a fixed mirror 57. Further, alignment system ALG and the fixed mirror fixed thereto are omitted in FIG. 1.

In this embodiment, wafer X interferometer $18X_1$ and Y interferometer 18Y are used for calibration of an encoder system that is used during an exposure operation of wafers, and wafer X interferometers $18X_2$ and wafer Y interferometer 18Y are used during mark detection by alignment system ALG. Incidentally, in this embodiment, instead of forming reflection surfaces 17X and 17Y on the end surfaces of wafer table WTB, a movable mirror (planar mirror) can be fixed to the end of wafer stage WST.

Further, on wafer stage WST, a fiducial mark plate (not shown) is fixed in a state where its surface has the same height as wafer W. On the surface of the fiducial mark plate, at least one pair of first fiducial marks for reticle alignment and a second fiducial mark for baseline measurement of alignment system ALG, which has a known positional relation with the first fiducial marks, and the like are formed.

Exposure apparatus 100 of this embodiment is further equipped with a pair of reticle alignment systems 13A and 13B (not shown in FIG. 1, refer to FIG. 4) that are placed a predetermined distance apart in the X-axis direction above reticle stage RST. As reticle alignment systems 13A and 13B, a TTR (Through The Reticle) alignment system is used that uses a light with an exposure wavelength for simultaneously observing a pair of the first fiducial marks on wafer stage WST and a pair of reticle marks on a reticle corresponding to the first fiducial marks via projection optical system PL. The detailed configuration of the reticle alignment system is disclosed in, for example, U.S. Pat. No. 5,646,413 and the like. Incidentally, as the reticle alignment system, for example, an aerial image measuring system whose light-receiving surface having a slit opening is placed on wafer stage WST can be used instead or together. In this case, the first fiducial marks described earlier do not have to be arranged.

Similarly, although omitted in FIG. 1, exposure apparatus 100 is further equipped with a multipoint focal position detecting system by an oblique incident method that is composed of an irradiation system 42a and a photodetection system 42b (refer to FIG. 4), which is similar to the one disclosed in, for example, U.S. Pat. No. 5,448,332 and the like.

Further, in exposure apparatus 100, in the vicinity of projection unit PU, alignment system ALG described earlier (not shown in FIG. 1, refer to FIG. 3) is arranged. As alignment system ALG, for example, an FIA (Field Image Alignment) system by an image processing method is used. Alignment system ALG supplies positional information of marks with an index center serving as a reference to main controller 20. Based on the information that has been supplied and on the measurement values of the measurement axes corresponding to measurement beams $B4_1$ and $B4_2$ of wafer Y interferometer 18Y and the measurement values of wafer X interferometer $18X_2$ of interferometer system 18, main controller 20 measures positional information of the mark subject to detection, or more specifically, the second fiducial mark on the fiducial mark plate or the alignment mark on the wafer on a coordinate system (an alignment coordinate system) that is defined by the measurement axes of wafer Y interferometer 18Y and wafer X interferometer $18X_2$.

FIG. 4 shows a control system related to stage control of exposure apparatus of this embodiment in a block diagram, with the system being partially omitted. The control system shown in FIG. 4 includes a so-called microcomputer (or workstation), which is composed of a CPU (Central Processing Unit), an ROM (Read Only Memory), an RAM (Random Access Memory), and the like, and is mainly configured by main controller 20 that performs overall control of the entire apparatus.

In exposure apparatus 100 having the configuration as described above, during a wafer alignment operation that is performed by a known EGA (Enhanced Global Alignment), which is disclosed in, for example, U.S. Pat. No. 4,780,617, and the like, as is described above, based on the measurement values of wafer Y interferometer 18Y and wafer X interferometer $18X_2$ of interferometer system 18, the position of wafer stage WST within the XY plane is controlled by main controller 20, and during operations other than the wafer alignment operation, for example, during an exposure operation, based on the measurement values of encoders 50A to 50D, the position of wafer stage WST is controlled by main controller 20.

Accordingly, during a period after the wafer alignment operation is completed until the exposure is started, a switching operation of a position measurement system needs to be performed, in which the position measurement system used for position measurement of the wafer stage within the XY plane is switched from wafer Y interferometer 18Y and wafer X interferometer $18X_2$ to encoders 50A to 50D. This switching operation of the position measurement system is performed roughly in the following procedure.

After the wafer alignment is completed, main controller 20 drives wafer stage WST in a predetermined direction, for example, in the +Y direction, based on the measurement values of interferometers 18Y, $18X_2$, $18Z_1$ and $18Z_2$.

Then, when wafer stage WST reaches a position where the measurement beam from interferometer $18X_2$ and the measurement beam from interferometer $18X_1$ are simultaneously irradiated to reflection surface 17X, main controller 20 adjusts the attitude of wafer stage WST based on the measurement values of interferometer system 18 (interferometers 18Y, $18X_2$, $18Z_1$ and $18Z_2$) so that a θz rotation (yawing) error (and a θx rotation (pitching) error and a θy rotation (rolling) error) is reduced to zero, and then pre-sets the measurement value of interferometer $18X_1$ to a same value as the measurement value of interferometer $18X_2$ at the point in time.

After the pre-setting, wafer stage WST is stopped at the position for a predetermined period of time until the influence of short-term variation due to air fluctuations (temperature fluctuations of air) of the measurement value of each axis of interferometers $18X_1$ and 18Y is reduced to an ignorable level by averaging effect, and the averaged value of the measurement values of interferometer $18X_1$ acquired during the stop time (the averaged value during the stop time) is carried over as the measurement value of X linear encoders 50B and 50D, and also the averaged value of the averaged values (the averaged values during the stop time) of the respective measurement values of a plurality of axes of interferometer 18Y acquired during the stop time is carried over as the measurement value of Y linear encoders 50A and 50C. Accordingly, the pre-setting of X linear encoders 50B and 50D and Y linear encoders 50A and 50C, or more specifically, the switching operation of the position measuring system is completed. After that, main controller 20 controls the position of wafer stage WST based on the measurement values of encoders 50A to 50D.

In exposure apparatus 100 of this embodiment, similar to the conventional scanning stepper, a series of operations such as reticle alignment (which includes relating the reticle coordinate system to the wafer coordinate system) and baseline measurement of alignment system ALG is performed using the fiducial mark plate on wafer stage WST, alignment system ALG and the like. Position control of reticle stage RST and wafer stage WST during the series of operations is performed based on the measurement values of reticle interferometer 16 and interferometer system 18.

Next, main controller 20 performs wafer exchange on wafer stage WST (performs wafer loading, in the case where there is no wafer on wafer stage WST) using a wafer loader (not shown), and wafer alignment (e.g. EGA or the like) with respect to the wafer using alignment system ALG. With this wafer alignment, an arrangement coordinate of a plurality of shot areas on the wafer on the alignment coordinate system described previously is obtained.

After that, the switching of the position measuring system described earlier is performed, and while controlling the position of wafer stage WST based on the baseline measured in advance and the measurement values of encoders 50A to 50D, and controlling the position of reticle stage RST based on the measurement values of reticle interferometer 16 described previously, main controller 20 performs exposure by step-and-scan method in the procedure similar to that of the conventional scanning stepper, thereby a pattern of reticle R is transferred onto a plurality of shot areas, respectively, on the wafer.

Figure 5A:
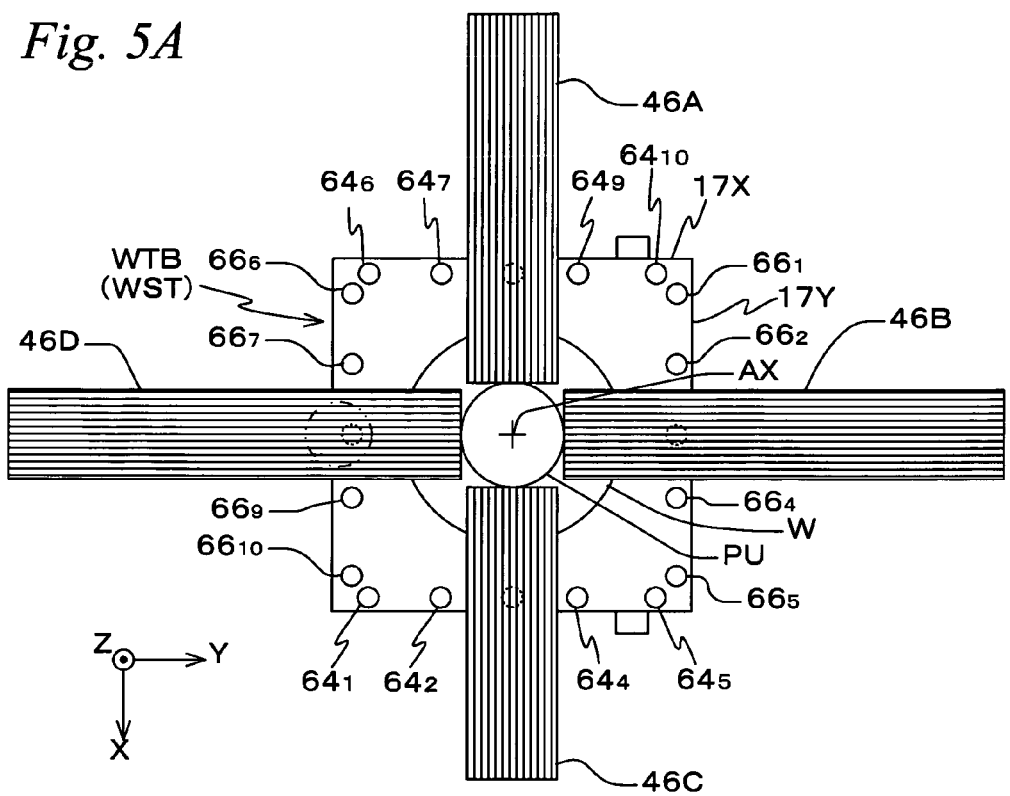
FIG. 5A is a view showing a state where the wafer stage is located at a position at which a portion near the center of a wafer is positioned directly under a projection unit PU.
Figure 5B:
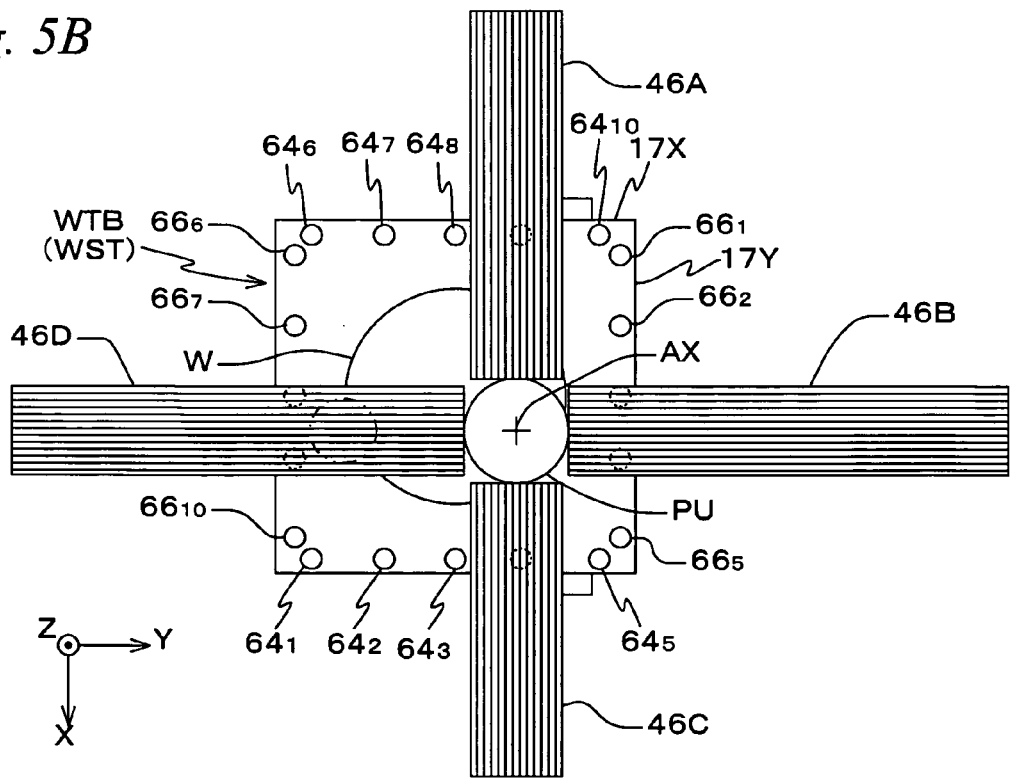
FIG. 5B is a view showing a state where the wafer stage is located at a position at which a mid portion between the center and the circumference of the wafer is positioned directly under the projection unit.
Figure 6A:
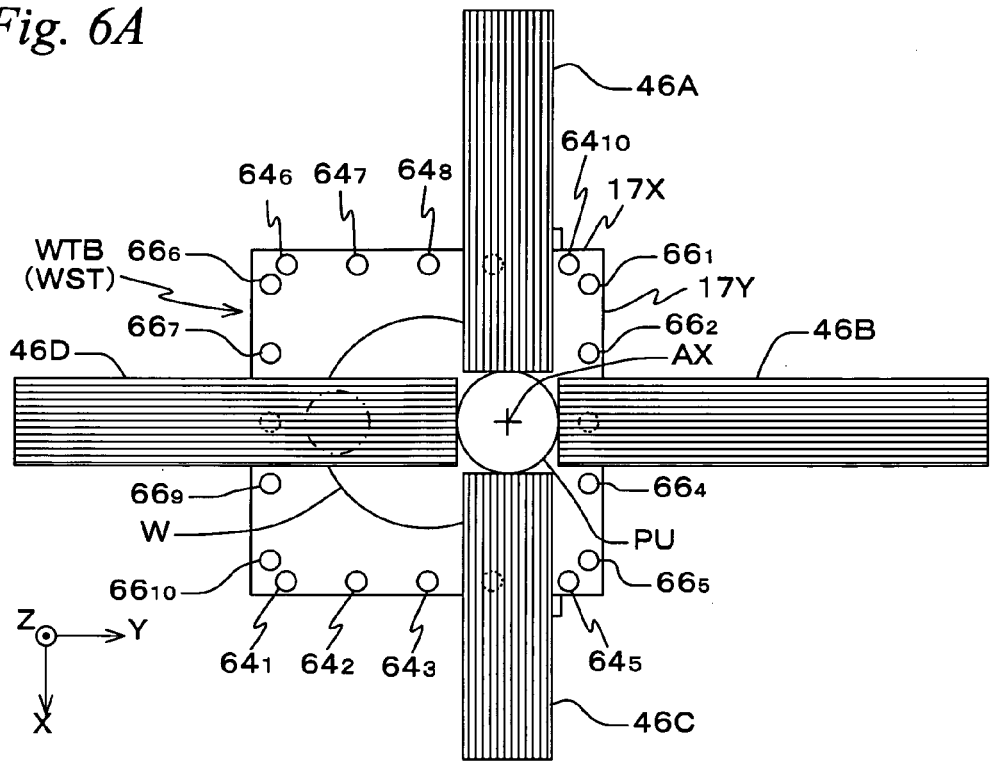
FIG. 6A is a view showing a state where the wafer stage is located at a position at which a portion near a +Y side edge of the wafer is positioned directly under projection unit PU.
Figure 6B:
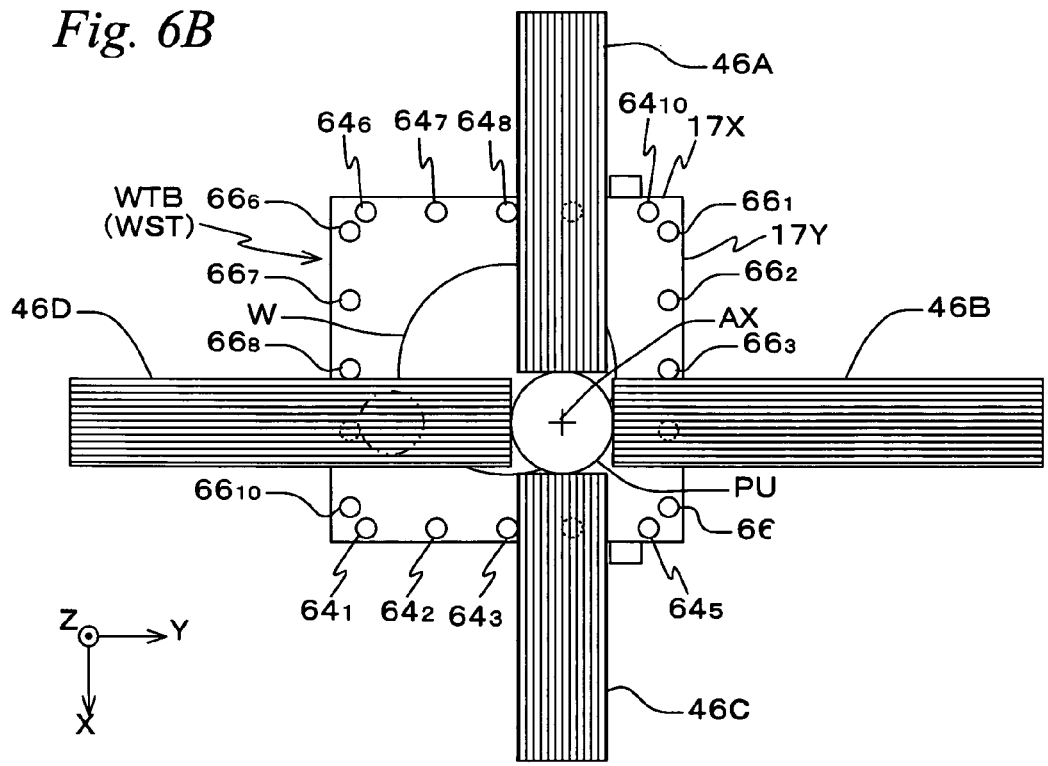
FIG. 6B is a view showing a state where the wafer stage is located at a position at which a portion near an edge of the wafer, which is angled at 45 degrees with respect to the X-axis and the Y-axis when viewed from the center of the wafer, is positioned directly under projection unit PU.
Figure 7:
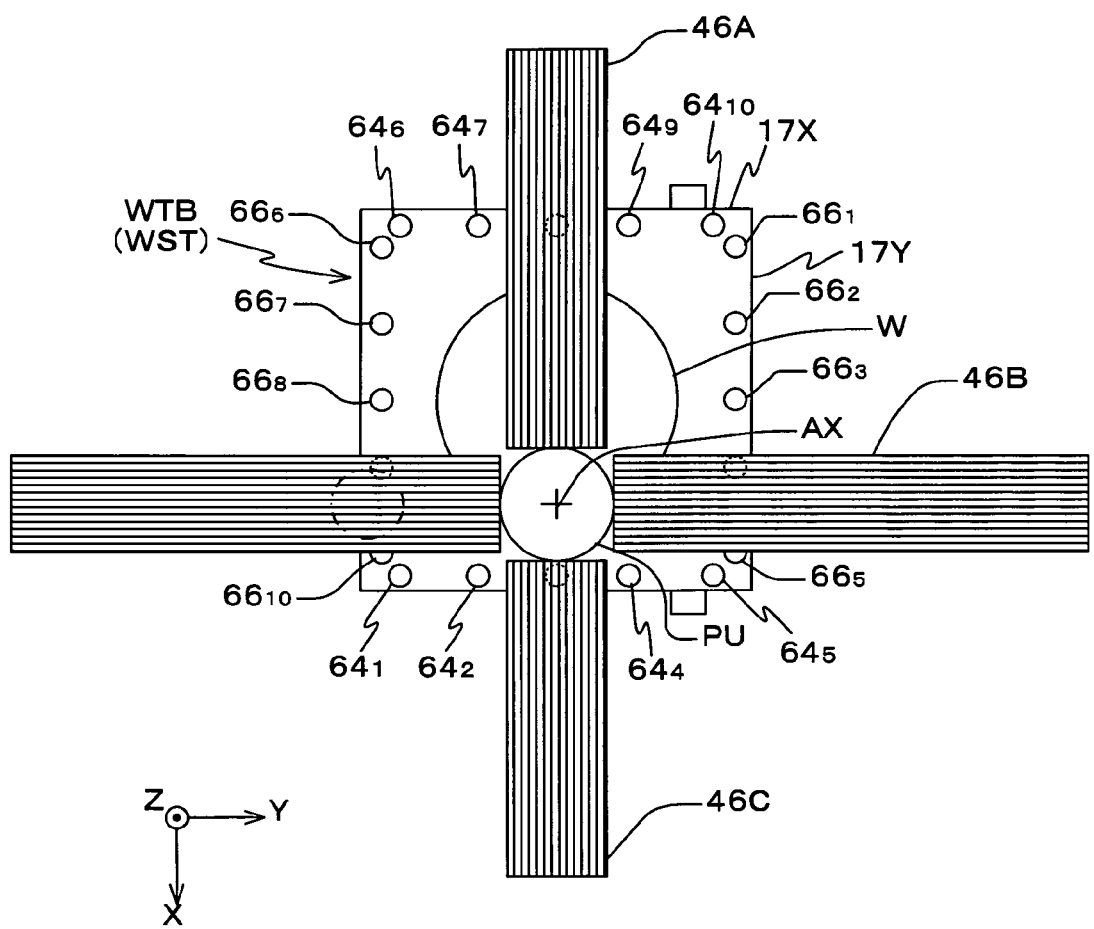
FIG. 7 is a view showing a state where the wafer stage is located at a position at which a portion near a +X side edge of the wafer is positioned directly under projection unit PU.

FIG. 5A shows a state where wafer stage WST is located at a position where the vicinity of the center of wafer W is directly under projection unit PU, and FIG. 5B shows a state where wafer stage WST is located at a position where the vicinity of an area in between the center and the periphery of wafer W is directly under projection unit PU. Further, FIG. 6A shows a state where wafer stage WST is located at a position where the vicinity of the +Y side edge of wafer W is directly under projection unit PU, and FIG. 6B shows a state where wafer stage WST is located at a position where the vicinity of the edge, which is in a direction angled at 45-degrees with respect to the X-axis and the Y-axis when viewed from the center of wafer W, of wafer W is directly under projection unit PU. Further, FIG. 7 shows a state where wafer stage WST is located at a position where the vicinity of the +X side edge of wafer W is directly under projection unit PU. When viewing FIGS. 5A to 7, it can be seen that in any one of these drawings, at least one head (in this embodiment, one head or two heads), which belongs to each group of four groups consisting of Y heads $64_1$ to $64_5$, Y heads $64_6$ to $64_{10}$, X heads $66_1$ to $66_5$, and X heads $66_6$ to $66_{10}$ on wafer table WTB faces a corresponding scale member. As can be seen when comprehensively considering this fact, and the symmetric arrangement of scale members 46A to 46D in the vertical direction and the horizontal direction with optical axis AX of projection optical system PL as the center, and the symmetric arrangement of Y heads $64_1$ to $64_{10}$ and X heads $66_1$ to $66_{10}$ in the X-axis direction and the Y-axis direction with respect to the center of wafer stages WST, in exposure apparatus 100, even if wafer stage WST is located at any position within a movement range of wafer stage WST during exposure, one each of Y heads $64_1$ to $64_5$ and Y heads $64_6$ to $64_{10}$, and X heads $66_1$ to $66_5$ and X heads $66_6$ to $66_{10}$ faces the corresponding moving scale, and measurement of the X-position and the Y-position of wafer stage WST with four encoders 50A to 50D can be almost simultaneously performed at all times.

In other words, the length of the arrangement area of each of the four head groups, $64_1$ to $64_5$, $64_6$ to $64_{10}$, $66_1$ to $66_5$ and $66_6$ to $66_{10}$ (e.g., in the case of head group $64_1$ to $64_5$, the distance to cover head $64_1$ and $64_5$) is set longer than a size (diameter) of wafer W so as to cover the entire area of the movement stroke (movement range) of wafer stage WST when scanning exposure is performed to at least the entire surface of wafer W (in this embodiment, so that any of four head groups $64_1$ to $64_5$, $64_6$ to $64_{10}$, $66_1$ to $66_5$ and $66_6$ to $66_{10}$ (measurement beams) does not move off from the corresponding scale member (diffraction grating), or more specifically, so that any of the four head groups does not become incapable of performing measurement, at least during scanning exposure and a period of acceleration/deceleration and synchronous stabilization of wafer stage WST before and after the scanning exposure, for all the shot areas).

Further, similarly, the length of each of four scale members 46A to 46D in each longitudinal direction (which corresponds to the width of the diffraction grating) is set longer than or equal to around the movement stroke so as to cover the entire area of the movement stroke of wafer stage WST when scanning exposure is performed to at least the entire surface of wafer W (i.e., so as to prevent four head groups $64_1$ to $64_5$, $64_6$ to $64_{10}$, $66_1$ to $66_5$ and $66_6$ to $66_{10}$ (measurement beams) from moving off from the corresponding scale members (diffraction gratings), or more specifically, so as to prevent the four head groups from becoming incapable of performing measurement, at least during the exposure operation for wafer W).

As is described in detailed above, according to exposure apparatus 100 of the present embodiment, encoder system 50 computes positional information of wafer stage WST in directions of three degrees of freedom within the XY plane based on the output of a pair of Y heads 64 that respectively face scale members 46A and 46C and the output of a pair of X heads 66 that respectively face scale members 46B and 46D, and in response to instructions of main controller 20, wafer stage drive system 27 drives wafer stage WST along the XY plane based on the positional information computed by encoder system 50. Accordingly, it becomes possible to drive wafer stage WST with high precision along the XY plane based on the measurement values of encoder system 50, in the entire area of the movement range of wafer stage WST, without placing the scales (gratings) so as to correspond to the entire area of the movement range of wafer stage WST.

Further, according to exposure apparatus 100 of the present embodiment, during scanning exposure to each shot area on wafer W, main controller 20 can drive reticle R (reticle stage RST) and wafer W (wafer stage WST) in the scanning direction (the Y-axis direction) with high precision based on the measurement values of reticle interferometer 16 and encoders 50A and 50C (and 50B and 50D), and can also drive wafer W (wafer stage WST) in the non-scanning direction (the X-axis direction) with high precision, which also makes it possible to perform the high-precision positioning (alignment) of reticle R (reticle stage RST) and wafer W (wafer stage WST) in the non-scanning direction. Accordingly, the pattern of reticle R can be formed with high precision on a plurality of shot areas on wafer W.

Incidentally, for each encoder used in this embodiment, various methods such as the diffraction interference method described above, or a so-called pickup method can be used, and a scan encoder or the like, which is disclosed in, for example, U.S. Pat. No. 6,639,686 and the like, can be used.

Figure 8:
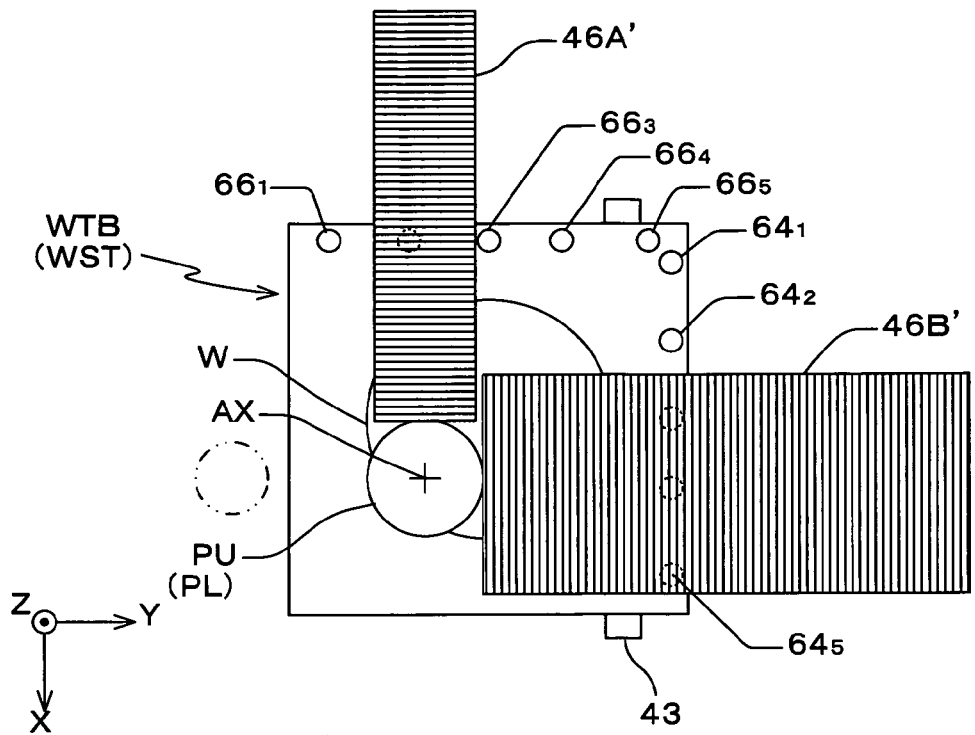
FIG. 8 is a view showing an encoder system for a wafer stage related to another embodiment.

Next, another embodiment of the present invention is described based on FIG. 8. In an exposure apparatus of this embodiment, since only an encoder system for a wafer stage is different from that in the previously described embodiment, the encoder system is described below. Incidentally, only the configuration of the encoder system is the difference from FIG. 3, and therefore in the description below, the same reference signs are applied to the constituents having the same or equivalent operations or functions as/to those shown in FIG. 3, and the explanation thereof is omitted. Further, interferometer system 18 is omitted in FIG. 8.

As shown in FIG. 8, scale members 46A' and 46B' each having an elongated rectangular plate shape are placed on the −X side and the +Y side of the lowermost end of projection unit PU. These scale members 46A' and 46B' are actually fixed to the barrel platform in a suspended state via a support member.

Scale member 46A' is placed on the −X side of projection unit PU with the X-axis direction serving as its longitudinal direction, in a state where an extended line of a center line related to a direction perpendicular to the longitudinal direction (a center line extending in the longitudinal direction) is orthogonal to the optical axis of projection optical system PL. On the surface (the −Z side surface) of scale member 46A', a reflective type diffraction grating with a predetermined pitch, for example, with a 1 µm pitch whose periodic direction is in the X-axis direction is formed in the similar manner to the manner previously described.

Further, scale member 46B' is placed on the +Y side of projection unit PU with the Y-axis direction serving as its longitudinal direction, in a state where an extended line of a center line related to a direction perpendicular to the longitudinal direction (a center line extending in the longitudinal direction) is orthogonal to the extended line of the center axis of scale member 46A' in the longitudinal direction at the optical axis of projection optical system PL. On the surface (the −Z side surface) of scale member 46B', a reflective type diffraction grating with a predetermined pitch, for example, with a 1 µm pitch whose periodic direction is in the Y-axis direction is formed in the similar manner to the manner previously described. In this case, the width of scale member 46A' in a direction perpendicular to the longitudinal direction (the width of the diffraction grating) is almost the same as that of scale member 46A described earlier, and the width of scale member 46B' (the width of the diffraction grating) is about twice the width of scale member 46A' (the width of the diffraction grating).

Meanwhile, on the upper surface of wafer table WTB, X heads $66_1, 66_2, \ldots, 66_5$ are placed respectively at positions where Y heads $64_6, 64_7, \ldots, 64_{10}$ were placed in the embodiment described earlier. Further, on the upper surface of wafer table WTB, Y heads $64_1, 64_2, \ldots, 64_5$ are placed respectively at positions where X heads $66_1, 66_2, \ldots, 66_5$ were placed in the embodiment described earlier.

In this embodiment, in the movement range of wafer stage WST during exposure where wafer W is located below projection optical system PL, at least two adjacent Y heads $64_i$ and $64_{i+1}$ (i=any one of 1 to 4) simultaneously face scale member 46B', and also at least one X head $66_p$ (p=any one of 1 to 5) faces scale member 46A'. More specifically, the measurement values of a total of three encoders, which are two Y linear encoders constituted by Y heads $64_i$ and $64_{i+1}$ facing scale member 46B', and an X linear encoder constituted by X head $66_p$ facing scale member 46A', are supplied to main controller 20. Based on positional information in the X-axis and Y-axis directions and rotational information in the θz direction of wafer stage WST, which are computed based on the measurement values of these three encoders, main controller 20 performs position control of wafer stage WST via wafer stage drive system 27. Accordingly, two-dimensional drive of wafer stage WST with high precision becomes possible in the same manner as in the above-described embodiment.

Incidentally, in FIG. 8, the length of the arrangement area of the two head groups, $64_1$ to $64_5$ and $66_1$ to $66_5$ (e.g., in the case of head group $64_1$ to $64_5$, the distance to cover head $64_1$ and $64_5$) is set longer than a size (diameter) of wafer W so as to cover the entire area of the movement stroke (movement range) of wafer stage WST at least during the exposure operation of wafer W (in other words, so as to prevent each of the head groups (measurement beams) from moving off from the corresponding scale member (diffraction grating), or more specifically, so as to prevent each of the head groups from becoming incapable of performing measurement, during scanning exposure of all the shot areas). Further, in the encoder system shown in FIG. 8, the length (corresponding to the formation range of the diffraction grating) of scale member 46A' or scale member 46B' in the longitudinal direction is set longer than or equal to around the movement stroke so as to cover the entire area of the movement stroke (movement range) of wafer stage WST at least during the exposure operation of wafer W (in other words, so as to prevent each of the head groups (measurement beams) from moving off from the corresponding scale (diffraction grating), or more specifically, so as to prevent each of the head groups from becoming incapable of performing measurement, during scanning exposure of all the shot areas).

Figure 9:
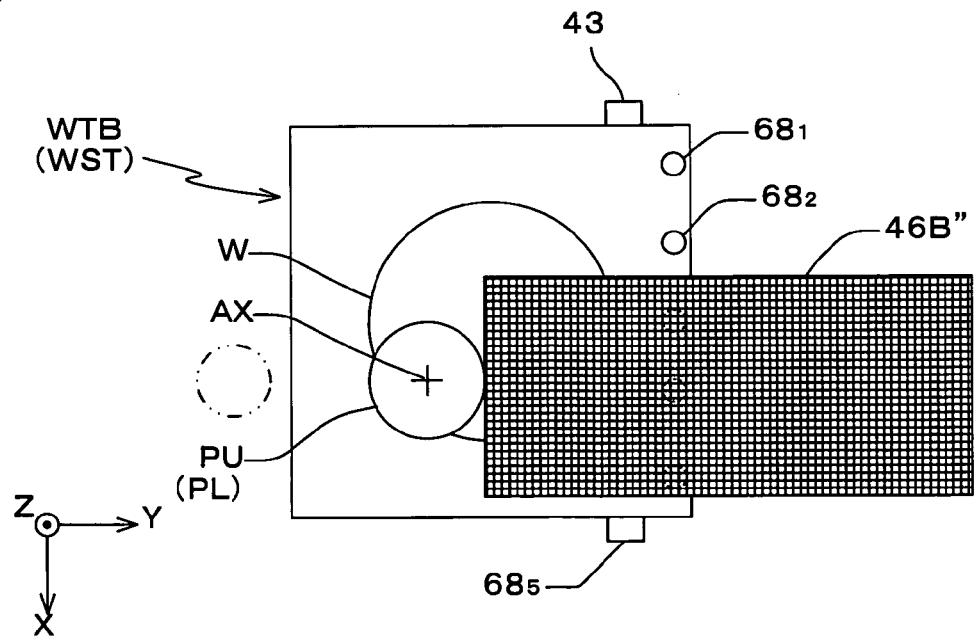
FIG. 9 is a view showing an encoder system for a wafer stage related to yet another embodiment.

Next, yet another embodiment of the present invention is described based on FIG. 9. In an exposure apparatus of this embodiment, since only an encoder system for a wafer stage is different from that in the previously described embodiments, the encoder system is described below. Incidentally, only the configuration of the encoder system is the difference from FIG. 3, and therefore in the description below, the same reference signs are applied to the constituents having the same or equivalent operations or functions as/to those shown in FIG. 3, and the explanation thereof is omitted.

In FIG. 9, a scale member 46B" having an elongated rectangular plate shape is placed on the +Y side of the lowermost end of projection unit PU. Scale member 46B" has the same size (length and width) as scale member 46' described previously. On the surface (the −Z side surface) of scale member 46B", however, a reflective type two-dimensional diffraction grating that is composed of a grating with a predetermined pitch, for example, a 1 μm pitch having a periodic direction in the Y-axis direction and a grating with a predetermined pitch, for example, a 1 μm pitch having a periodic direction in the X-axis direction is formed.

Further, on the upper surface of wafer table WTB, five two-dimensional heads (2D heads) $68_1$ to $68_5$ are placed at a predetermined distance in the X-axis direction, in the same arrangement as with head groups $64_1$ to $64_5$ shown in FIG. 8 described previously. Each two dimensional head can be configured, for example, including a pair of X diffraction gratings and a pair of Y diffraction gratings (fixed scales) that emit measurement beams in the +Z direction and converge diffracted lights of a predetermined order of the measurement beams from the two-dimensional diffraction grating; an index scale made up of a transmissive type two-dimensional diffraction grating, which makes the diffracted lights that have been converged respectively at the pair of X diffraction gratings and the pair of Y diffraction gratings interfere; a detector that detects the lights that have interfered at the index scale. More specifically, a two-dimensional encoder head by a so-called three grating diffraction interference method can be used as 2D heads $68_1$ to $68_5$. Incidentally, instead of the 2D heads, a one-dimensional head (X head) with a measurement direction in the X-axis direction and a one-dimensional head (Y head) with a measurement direction in the Y-axis direction can be used in combination. In this case, the irradiation positions of the measurement beams of the X head and the Y head do not have to be at a same position. Incidentally, in the present description, a term "two-dimensional head" is used as a concept including the combination of two one-dimensional heads like the combination of the X head and the Y head as described above.

In the stage device equipped with the encoder system having the configuration shown in FIG. 9, in the movement range of wafer stage WST during exposure where wafer W is located under projection optical system PL, at least two adjacent 2D heads $68_i$ and $68_{i+1}$ (i=any one of 1 to 4) simultaneously face scale member 46B". More specifically, the measurement values of the two two-dimensional encoders constituted by 2D heads $68_i$ and $68_{i+1}$ that face scale member 46B" are supplied to main controller 20. Main controller 20 performs position control of wafer stage WST via wafer stage drive system 27, based on positional information in the X-axis and Y-axis directions and rotational information in the θz direction of wafer stage WST that are computed based on the measurement values of these two encoders. Accordingly, high-precision two-dimensional drive of wafer stage WST becomes possible in the same manner as in the embodiments above.

Incidentally, in the cases such as where the rotational information of wafer stage WST in the θz direction does not have to be measured, or where the rotational information in the θz direction measured by interferometer system 18 is used, a configuration can be employed in which at least one of 2D heads $68_1$ to $68_5$ faces scale member 46B". In this case, instead of scale member 46B", two scale members in which two-dimensional diffraction gratings are formed can be arranged. By doing so, the entire area of the movement range of wafer stage WST at least during the exposure operation can be covered while keeping the size of each scale member from increasing. In this case, the two scale members can be placed so that the respective longitudinal directions are orthogonal to each other or can be placed with the respective longitudinal directions in a same direction.

Incidentally, in each of the embodiments above, although position control of wafer stage WST is to be performed using the encoder system described earlier during the exposure operation of the wafer, position control of wafer stage WST can be performed using the encoder system shown in the drawings such as FIGS. 3, 8, and 9 also in operations such as an alignment operation (including at least a mark detection operation with alignment system ALG) and/or an exchange operation of wafers. In this case, the switching operation of the position measuring system described previously naturally becomes unnecessary.

In this case, in the case where the encoder system described earlier (FIGS. 3, 8 and 9) is used also during operations such as detection of alignment marks on wafer W or the second fiducial marks of wafer stage WST using alignment system ALG, it is preferable that the arrangement (e.g. including at least one of the position and the number) of the heads and/or the arrangement of the scale members (e.g. including at least one of the position, the number and the size) are/is set also taking into consideration the movement range of wafer stage WST during this detection operation. More specifically, also during the detection operation of the marks that is performed after the wafer stage is moved to the measurement position of alignment system ALG, for example, in order to make position measurement in directions of three degrees of freedom of the X-axis, Y-axis and θz directions possible, it is preferable that the arrangement of the heads and/or the scale members is set so that at least three heads constantly continue to face the same and/or different scale(s) (diffraction grating(s)) corresponding thereto, or more specifically, so that the position control of the wafer stage is prevented from discontinuing due to the position measurement with the encoder system becoming impossible. In this case, as an example, the size of the scale members in each of the embodiments can be set so that the scale members can be used both in the exposure operation and the alignment operation, or scale members to be used in the alignment operation can be arranged separately from the scale members described previously. Especially in the latter case, for example, the scale members should be arranged for alignment system ALG in the arrangement similar to the arrangement as shown in the drawings such as FIGS. 3, 8 and 9. Or, by using at least one of a plurality of scale members used in the exposure operation and at least one scale member arranged separately, position measurement of wafer stage WST can be performed with the encoder system also in the alignment operation or the like.

Incidentally, during detection of the first fiducial marks of wafer stage WST with the reticle alignment system described earlier, and/or during detection of projected images of marks of reticle R or reference marks of reticle stage RST with the aerial image measuring system described earlier, the position measurement of wafer stage WST with the interferometer system described previously can be performed, but it is preferable that the position measurement of wafer stage WST is performed with the encoder system including the scale members of each of the above-described embodiments.

Further, in the case where the encoder system described earlier (FIGS. 3, 8 and 9) is used when wafer stage WST is located at the exchange position of wafers (including at least one of the loading position and the unloading position), it is preferable that the arrangement and the like of the heads and/or the scales are set, in the similar manner to the manner described earlier, taking into consideration the movement range of the wafer stage in the wafer exchange operation as well. More specifically, it is preferable that the arrangement of the heads and/or the scale members is set so that the position control of the wafer stage is prevented from discontinuing due to the position measurement with the encoder system becoming impossible, also at the wafer exchange position. Further, this can be said for the case where the encoder system described earlier (FIGS. 3, 8 and 9) is used during movement of wafer stage WST between the exchange position of wafers and the exposure position where a reticle pattern is transferred via projection optical system PL or the measurement position where mark detection with alignment system ALG is performed, and/or between the measurement position of alignment system ALG and the exposure position.

Moreover, as is disclosed in, for example, U.S. Pat. No. 6,262,796 and the like, also in the case of an exposure apparatus by a twin-wafer-stage method that can execute an exposure operation and a measurement operation (e.g. mark detection with an alignment system and the like) almost in parallel using two wafer stages, position control of each wafer stage can be performed using the encoder system described earlier (FIGS. 3, 8 and 9) in which heads are arranged at each wafer stage similarly to each of the embodiments above. In this case, not only during the exposure operation but also during another operation, for example, during the measurement operation, position measurement of each wafer stage can be performed with the encoder system described earlier by appropriately setting the arrangement of the heads and/or the scale members in the similar manner to the manner described previously. For example, by appropriately setting the arrangement of the heads, position control of each wafer stage can be performed using the scale members of each of the embodiments above without change, but a scale member that can be used during the measurement operation can also be arranged separately from the foregoing scale members. In this case, as an example, four scale members that are placed in the arrangement similar to the scale members of each of the embodiments above, for example, placed in a cross shape with alignment system ALG as the center are arranged, and positional information of each wafer stage can be measured with these scale members and the corresponding heads during the measurement operation described above. In the case of the exposure apparatus by a twin-wafer-stage method, for example, heads are arranged respectively in the arrangement similar to the previously-described case (FIGS. 3, 8 and 9) and when the exposure operation of a wafer mounted on one wafer stage is completed, the other wafer stage on which a next wafer, to which mark detection and the like have been performed at the measurement position, is mounted is placed at the exposure position in exchange of the one wafer stage. Further, the measurement operation that is performed in parallel with the exposure operation is not limited to mark detection of the wafer with the alignment system, but detection of surface information (such as level difference information) of the wafer can also be performed instead of or in combination with the mark detection.

Incidentally, in the description above, in the case where position control of the wafer stage using the encoder system described previously is discontinued at the measurement point or the exchange point, or during movement of the wafer stage from one of the exposure position, the measurement position and the exchange position to the other position, the position control of the wafer stage at the respective positions or during the movement referred to above is preferably performed using another measurement device (e.g. an interferometer, an encoder, or the like) that is separate from the encoder system.

Further, in each of the embodiments above, as is disclosed in, for example, the pamphlet of International Publication No. 2005/074014 (the corresponding U.S. Patent Application Publication No. 2007/0127006) and the like, a measurement stage is arranged separately from the wafer stage and the measurement stage is placed directly under projection optical system PL in exchange of the wafer stage during operations such as the exchange operation of wafers, and the characteristics of the exposure apparatus (e.g. the image-forming characteristic (wavefront aberration) of the projection optical system, the polarization characteristic of illumination light IL, or the like) can be measured. In this case, the heads are also placed on the measurement stage and position control of the measurement stage can be performed using the scale members described earlier. Further, during the exposure operation of a wafer mounted on the wafer stage, the measurement stage withdraws to a predetermined position that does not interfere with the wafer stage and accordingly the measurement stage is moved between this withdrawal position and the exposure position. Therefore, the arrangement of the heads and/or the scale members is preferably set similarly to the case described earlier so as to prevent position measurement by the encoder system from becoming impossible and position control of the measurement stage from being discontinued also at the withdrawal position or also during movement from one of the withdrawal position and the exposure position to the other, by also taking a movement range of the measurement stage into consideration similarly to the case of the wafers stage. Alternatively, in the case where the position control of the measurement stage by the encoder system described earlier is discontinued at the withdrawal position or during the movement, the position control of the measurement stage is preferably performed using another measurement device (e.g. an interferometer, an encoder or the like) which is separate from the encoder system. Or, the position control of the measurement stage can be performed only with the interferometer system described earlier.

Further, in each of the embodiments above, a distance between a pair of the scale members that are arranged extending in a same direction has to be increased, due to, for example, a size of projection unit PU, and therefore during scanning exposure of a specific shot area on wafer W, for example, a shot area located on the outermost circumference, a corresponding head does not face one of the pair of the scale members in some cases. As an example, when the size of projection unit PU shown in FIG. 3 is slightly increased, any corresponding X head 66 does not face scale member 46B of a pair of scale members 46B and 46D. Furthermore, in a liquid immersion type exposure apparatus in which a space between projection optical system PL and a wafer is filled with a liquid (e.g. pure water or the like), which is disclosed in, for example, the pamphlet of International Publication No. 99/49504 and the like, a nozzle member or the like that supplies the liquid is arranged so as to enclose projection unit PU, and therefore it becomes more difficult to place the heads close to the exposure area described earlier of projection optical system PL. Accordingly, in the case of employing the encoder system shown in FIG. 3 in the liquid immersion type exposure apparatus, two pieces of positional information in each of the X-axis and Y-axis directions doe not have to be constantly measurable, but the encoder system should be configured so that two pieces of positional information are measurable in one of the X-axis and Y-axis directions and one piece of positional information is measurable in the other. More specifically, in the position control of the wafer stage (or the measurement stage) with the encoder system, two pieces of positional information in each of the X-axis and Y-axis directions, which are four pieces of positional information in total, do not necessarily have to be used.

Further, in each of the embodiments above, the configuration of interferometer system 18 is not limited to the one shown in FIG. 3, but for example, when the scale members are placed also at alignment system ALG (at the measurement position), interferometer system 18 does not have to be equipped with wafer X interferometer $18X_2$, or wafer X interferometer $18X_2$ can be constituted by, for example, a multiaxial interferometer similar to wafer Y interferometer 18Y, and rotational information (e.g. yawing and rolling) of wafer stage WST can also be measured besides the X-position of wafer stage WST. Furthermore, in each of the embodiments above, interferometer system 18 is to be used for calibration of the encoder system or for position measurement of the wafer stage in operations other than the exposure operation, but this is not to be intended to be limiting, and encoder system 50 and interferometer system 18 can be used together in at least one of the exposure operation, the measurement operation (including the alignment operation), and the like. For example, in the case where encoder system 50 cannot perform measurement or its measurement values are abnormal, encoder system 50 can be switched to interferometer system 18 to continue position control of wafer stage WST. Incidentally, in each of the embodiments above, interferometer system 18 does not have to be arranged, and the encoder system can only be arranged.

Further, in each of the embodiments above, the position of wafer stage WST in at least one of the X-axis and Y-axis directions is to be measured with encoder system 50, but this is not intended to be limiting, and position measurement in the Z-axis direction can also be performed. For example, heads by an encoder method that can measure the position in the Z-axis direction can be arranged on the wafer stage separately from the heads described previously, or the heads described previously can be heads that can measure the position in at least one of the X-axis and Y-axis directions and the position in the Z-axis direction.

Further, in the encoder system shown in FIGS. 3 and 8, at least either of the X heads or Y heads are replaced with the 2D heads and the scale member facing the 2D heads can be a scale member on which a two-dimensional diffraction grating is formed. In this case, in the encoder system shown in FIG. 3, the number of the scale members can be decreased from four to two at the fewest, and in the encoder system shown in FIG. 8, by using a scale member on which a two-dimensional grating is formed as scale member 46B' in particular, the width of the scale member 46B' can be narrower.

Further, each of the embodiments above, a configuration is employed in which a plurality of measurement beams can constantly be irradiated to one scale member, and in the case where one measurement beam becomes abnormal, measurement can be continued by switching it to another measurement beam. In this case, a plurality of measurement beams can be irradiated to the scale member from one head, or from a plurality of different heads. In the case where a plurality of measurement beams are irradiated to one scale member, the plurality of measurement beams are preferably irradiated to different positions on the scale member.

Further, each of scale members described earlier can be configured by making a plurality of small scale members be integrally held on a plate member or the like. In this case, when a head that faces a connecting section between the small scale members becomes unmeasurable or has measurement abnormality, position measurement can be performed alternatively using another head that faces sections other than the connecting section.

Further, the arrangement of the heads described in each of the embodiments above is an example, and the arrangement of the heads is not intended to be limiting.

Further, in each of the embodiments described above, the scale members are to be fixed in a suspension state to the barrel platform via the support member, but the scale members can be held by another holding member other than the barrel platform. Further, in each of the embodiments described above, the temperature adjustment of the scale members can also be performed as needed.

Further, in each of the embodiments described above, since the scales (gratings) do not have to be placed corresponding to the entire area of the movement range of wafer stage WST, there is also the effect that the air conditioning can be performed more easily.

Incidentally, in each of the embodiments described above, the case has been described where the present invention is applied to the scanning stepper, but this is not intended to be limiting, and the present invention can also be applied to a static exposure apparatus such as a stepper. Even with the stepper, by measuring the position of a stage, on which an object that is subject to exposure is mounted, using an encoder, occurrence of position measurement error caused by air fluctuations can be reduced to almost zero, which is unlike the case where the position of the stage is measured using an interferometer, and therefore the position of the stage can be set with high precision based on the measurement values of the encoder, which consequently makes it possible to transfer of a reticle pattern on the object with high precision. Further, the present invention can also be applied to a reduction projection exposure apparatus by a step-and-stitch method that synthesizes a shot area and a shot area.

Further, the magnification of the projection optical system in the exposure apparatus in each of the embodiments described above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image.

Further, illumination light IL is not limited to the ArF excimer laser light (wavelength: 193 nm), but can be an ultraviolet light such as a KrF excimer laser light (wavelength: 248 nm), or a vacuum ultraviolet light such as an $F_2$ laser light (wavelength: 157 nm). As is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in each of the embodiments above, illumination light IL of the exposure apparatus is not limited to the light having a wavelength more than or equal to 100 nm, and it is needless to say that the light having a wavelength less than 100 nm can be used. For example, the present invention can also be applied to an EUV (Extreme Ultraviolet) exposure apparatus that uses an EUV light in a soft X-ray range (e.g. a wavelength range from 5 to 15 nm). Besides such an apparatus, the present invention can also be applied to an exposure apparatus that uses charged particle beams such as an electron beam or an ion beam.

Further, in each of the embodiments above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used. In the case of using such a variable shaped mask, a stage on which a wafer, a glass plate or the like is mounted is scanned relative to the variable shaped mask, and therefore the equivalent effect to each of the embodiments above can be obtained by measuring the position of the stage with an encoder.

Further, as is disclosed in, for example, the pamphlet of International Publication No. 2001/035168, the present invention can also be applied to an exposure apparatus (lithography system) that forms line-and-space patterns on wafer W by forming interference fringes on wafer W.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Further, an apparatus that forms a pattern on an object is not limited to the exposure apparatus (lithography system) described previously, and for example, the present invention can also be applied to an apparatus that forms a pattern on an object by an ink-jet method.

Incidentally, an object on which a pattern is to be formed (an object subject to exposure to which an energy beam is irradiated) in each of the embodiments above is not limited to a wafer, but may be another object such as a glass plate, a ceramic substrate, a film member, or a mask blank.

The use of the exposure apparatus is not limited to the exposure apparatus for manufacturing semiconductor devices, but the present invention can also be widely applied, for example, to an exposure apparatus for liquid crystal display devices that transfers a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass substrate or silicon wafer to produce a reticle or a mask used in a light exposure apparatus, an EUV exposure apparatus, an X-ray exposure apparatus, an electron-beam exposure apparatus, and the like.

Incidentally, the movable body drive system of the present invention can be applied not only to the exposure apparatus, but can also be applied widely to other substrate processing apparatuses (such as a laser repair apparatus, a substrate inspection apparatus and the like), or to apparatuses equipped with a movable stage such as a position setting apparatus of a sample or a wire bonding apparatus in other precision machines.

Incidentally, the above disclosures of all the publications, the pamphlets of the International Publications, and specifications of the U.S. Patent Application Publications and the U.S. patents that are cited in the description above and related to exposure apparatuses and the like are each incorporated herein by reference.

Incidentally, semiconductor devices are manufactured through the following steps: a step where the function/performance design of a device is performed, a step where a reticle is manufactured based on this design step; a step where a wafer is manufactured from silicon materials; a lithography step where a pattern formed on the mask is transferred onto an object such a wafer by the exposure apparatus in each of the embodiments above; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, since the exposure apparatus of each of the embodiments above is used in the lithography step, the devices with high integration can be manufactured with good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam, the apparatus comprising:
   a movable body that can move along a predetermined plane, while holding the object, the predetermined plane including a first direction and a second direction orthogonal to each other;
   a scale section that is placed on a plane substantially parallel to the predetermined plane, and has at least one scale including a first scale:
   an encoder system that has a plurality of heads which are arranged on the movable body, and measures positional information of the movable body in directions of three degrees of freedom within the predetermined plane, at least during exposure of the object, using at least two heads of the plurality of heads the two heads including at least one head that faces the first scale and respectively facing corresponding scales of the scale section; and
   a projection system that projects the energy beam to the object, wherein
   the first scale has a rectangular grating area placed, with its longitudinal direction in the first direction, lateral to the projection system in a state in which one end of the grating area in the longitudinal direction faces an optical axis of the projection system, and
   the plurality of heads include at least three heads disposed at a predetermined distance in the second direction.

2. The exposure apparatus according to claim 1, further comprising:
   a holding member that holds the projection system, wherein
   the scale section is supported in a suspended state by the holding member.

3. The exposure apparatus according to claim 1, wherein each of the plurality of heads can measure positional information of the movable body in two different directions.

4. The exposure apparatus according to claim 1, wherein the scale section has a plurality of scales that include the first scale, and a second scale that has a rectangular grating area placed, with its longitudinal direction in the second direction, lateral to the projection system, and
   in the encoder system, the plurality of heads are arranged on the movable body so as to correspond to the plurality of the scales, respectively.

5. The exposure apparatus according to claim 1, further comprising:
   a mark detecting system that can detect a mark on the object, wherein
   the encoder system can measure positional information of the movable body during detection of the mark.

6. The exposure apparatus according to claim 5, wherein the scale section has another scale that is separate from the scale is separate from the first scale and is placed in proximity to the mark detecting system.

7. A device manufacturing method, comprising:
   exposing an object using the exposure apparatus according to claim 1; and
   developing the exposed object.

8. An exposure method of exposing an object held by a movable body that can move along a predetermined plane that includes a first direction and a second direction orthogonal to each other, with an energy beam, the method comprising:
   measuring positional information of the movable body in directions of three degrees of freedom within the predetermined plane, at least during exposure of the object, with at least two heads of a plurality of heads by using an encoder system that has the plurality of heads which are arranged on the movable body, the two heads respectively facing corresponding scales of a scale section that is placed on a plane substantially parallel to the predetermined plane and has at least one scale including a first scale, and the two heads including at least one head that faces the first scale, wherein
   the first scale has a rectangular grating area placed, with its longitudinal direction in the first direction, lateral to a projection system that projects the energy beam to the object, in a state in which one end of the grating area in the longitudinal direction faces an optical axis of the projection system, and
   the plurality of heads include at least three heads disposed at a predetermined distance in the second direction.

9. The exposure method according to claim 8, wherein the scale section is supported in a suspended state by a holding member that holds the projection system.

10. The exposure method according to claim 8, wherein as each of the plurality of heads, a head that can measure positional information of the movable body in two different directions is used.

11. The exposure method according to claim 8, wherein the scale section has a plurality of scales that include the first scale, and a second scale that has a rectangular grating area placed, with its longitudinal direction in the second direction, lateral to the projection system, and
   the plurality of heads are arranged on the movable body so as to correspond to the plurality of the scales, respectively.

12. The exposure method according to claim 8, wherein the encoder system can measure positional information of the movable body during detection of a mark on the object with a mark detecting system.

13. The exposure method according to claim 12, wherein another scale that is separate from the first scale is placed in proximity to the mark detecting system.

14. A device manufacturing method, comprising:
   exposing an object using the exposure method according to claim 8; and
   developing the exposed object.

15. The exposure apparatus according to claim 4, wherein at least one head of the plurality of heads is always facing a respective scale regardless of the position of the movable body at least during exposure of the object.

16. The exposure method according to claim 11, wherein at least one head of the plurality of heads is always facing a respective scale regardless of the position of the movable body at least during exposure of the object.

* * * * *